United States Patent

Yanagi

[11] Patent Number: 5,732,056
[45] Date of Patent: Mar. 24, 1998

[54] DECODING UNIT AND STORAGE UNIT

[75] Inventor: Shigenori Yanagi, Kawasaki, Japan

[73] Assignee: Fujitsu Ltd., Kawasaki, Japan

[21] Appl. No.: 584,677

[22] Filed: Jan. 11, 1996

[30] Foreign Application Priority Data

Mar. 31, 1995 [JP] Japan ................... 7-076762

[51] Int. Cl.$^6$ .................................... G11B 7/00
[52] U.S. Cl. ................. 369/59; 369/47; 369/50; 369/124; 360/48; 360/51
[58] Field of Search ............ 369/124, 59, 60, 369/47, 48, 49, 50, 54, 58, 32; 360/48, 51, 39

[56] References Cited

U.S. PATENT DOCUMENTS

| | | | |
|---|---|---|---|
| 5,353,271 | 10/1994 | Abe | 369/59 |
| 5,502,711 | 3/1996 | Clark et al. | 360/51 X |

FOREIGN PATENT DOCUMENTS

| | | |
|---|---|---|
| 0242576 | 10/1987 | European Pat. Off. . |
| 61-214278 | 9/1986 | Japan . |
| 63-263936 | 10/1988 | Japan . |
| 2116289 | 4/1990 | Japan . |
| 2132682 | 5/1990 | Japan . |
| 490168 | 3/1992 | Japan . |

OTHER PUBLICATIONS

"Data Interchange on 90 mm Optical Disk Cartridges", ISO/IEC JTC 1/SC 3 N 705, 1.23.06 Draft 2 Dec. 1994.

*Primary Examiner*—Muhammad N. Edun
*Attorney, Agent, or Firm*—Greer, Burns & Crain, Ltd.

[57] ABSTRACT

A decoding unit decodes data reproduced from a recording medium and obtained via first phase locked loop (PLL) and second PLL which are mutually independent and oscillate at frequencies which are approximately the same, where the recording medium is recorded with pulse width modulation (PWM) data which are obtained by converting data encoded by a predetermined modulation code that generates a pattern having a D.C. component. The decoding unit includes a first storage for successively storing a positive polarity data portion of the PWM data obtained via the first PLL and a negative polarity data portion of the PWM data obtained via the second PLL, a first delay for delaying the positive polarity data portion, a second delay for delaying the negative polarity data portion, a second storage for successively storing a delayed positive polarity data portion obtained via the first delay and a delayed negative polarity data portion obtained via the second delay, a controller for controlling write and read timings of the first storage and input and output timings of the first delay in synchronism with a first clock obtained via the first PLL, and for controlling a write timing of the second storage and an input timing of the second delay in synchronism with a second clock obtained via the second PLL, where the controller controls a read timing of the second storage and an output timing of the second delay in synchronism with the first clock, and a decoder which decodes the data successively read from the first and second storages.

22 Claims, 26 Drawing Sheets

FIG. 1A
PRIOR ART

| SM | VFO1 | AM | ID1 | VFO2 | AM | ID2 | PA |
|----|------|----|----|------|----|----|----|
| 8  | 26   | 1  | 5  | 16   | 1  | 5  | 1  |

FIG. 1B
PRIOR ART

| PFH | G | RF ||||| B |
|-----|---|------|---|----|----|---|
|     |   | VFO3 | S | DF | PA |   |
| 63  | 8 | 27   | 4 | 658 | 1 | 17 |

FIG. 1C
PRIOR ART

| PFH | G | RF ||||| B |
|-----|---|------|---|------|----|----|
|     |   | VFO3 | S | DF   | PA |    |
| 63  | 8 | 27   | 4 | 2458 | 1  | 23 |

FIG. 2

| PRECEDING CHANNEL BIT | PRESENT INPUT BIT | SUBSEQUENT INPUT BIT | CHANNEL BIT RLL (1,7) MODULATION CODE |
|---|---|---|---|
| X | 00 | 0X | 001 |
| 0 | 00 | 1X | 000 |
| 1 | 00 | 1X | 010 |
| 0 | 01 | 0X | 001 |
| 0 | 01 | 1X | 000 |
| 1 | 01 | 00 | 010 |
| 1 | 01 | NOT00 | 000 |
| 0 | 10 | 0X | 101 |
| 0 | 10 | 1X | 010 |
| 0 | 11 | 00 | 010 |
| 0 | 11 | NOT00 | 100 |

FIG. 3

| COLUMN NUMBER j → | | | | 0 | 1 | 2 | 3 | 4 | ROW NUMBER i ↓ |
|---|---|---|---|---|---|---|---|---|---|
| SB1 | SB2 | SB3 | SB4 | D1 | D2 | D3 | D4 | D5 | 103 |
| | | | | D6 | D7 | D8 | D9 | D10 | 102 |
| | | | | D11 | D12 | D13 | D14 | D15 | 101 |
| | | | | D16 | D17 | D18 | D19 | D20 | 100 |
| | RS1 | RS1 | | D21 | D22 | D23 | D24 | D25 | 99 |
| | | | | D26 | D27 | D28 | D29 | D30 | 98 |
| | | | | D31 | D32 | D33 | D34 | D35 | 97 |
| | RS25 | RS25 | | D501 | D502 | D503 | D504 | D505 | 3 |
| | | | | D506 | D507 | D508 | D509 | D510 | 2 |
| | | | | D511 | D512 | (FF) | (FF) | (FF) | 1 |
| | | | | (FF) | C1 | C2 | C3 | C4 | 0 |
| | RS26 | RS26 | | E1.1 | E2.1 | E3.1 | E4.1 | E5.1 | -1 |
| | | | | E1.2 | E2.2 | E3.2 | E4.2 | E5.2 | -2 |
| | | | | E1.3 | E2.3 | E3.3 | E4.3 | E5.3 | -3 |
| | RS29 | RS29 | | E1.13 | E2.13 | E3.13 | E4.13 | E5.13 | -13 |
| | | | | E1.14 | E2.14 | E3.14 | E4.14 | E5.14 | -14 |
| | | | | E1.15 | E2.15 | E3.15 | E4.15 | E5.15 | -15 |
| | | | | E1.16 | E2.16 | E3.16 | E4.16 | E5.16 | -16 |

104 ROWS

16 ROWS

FIG. 4

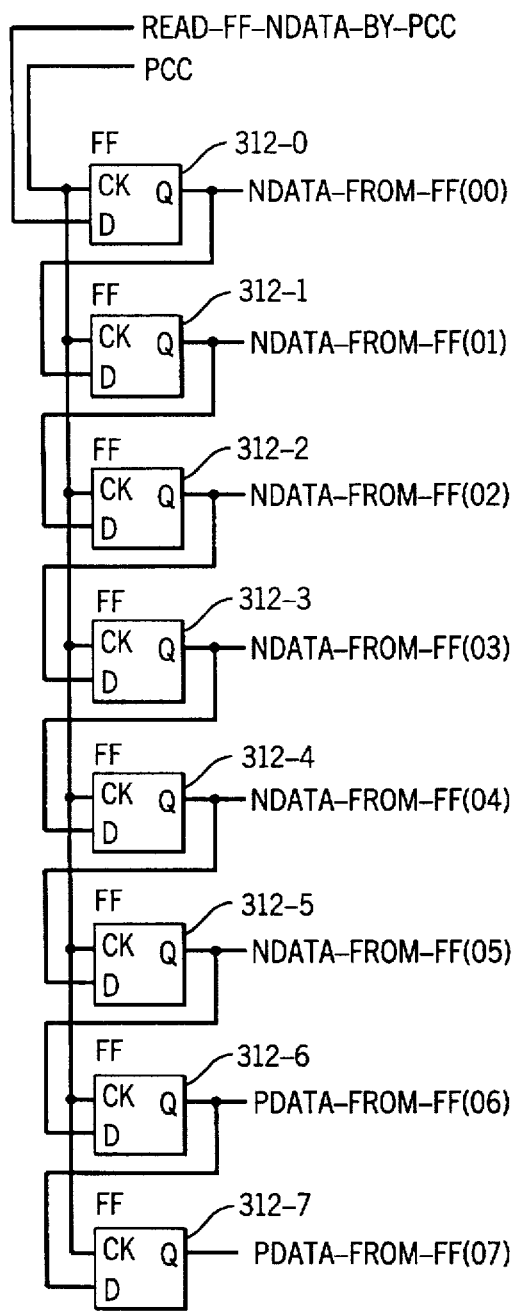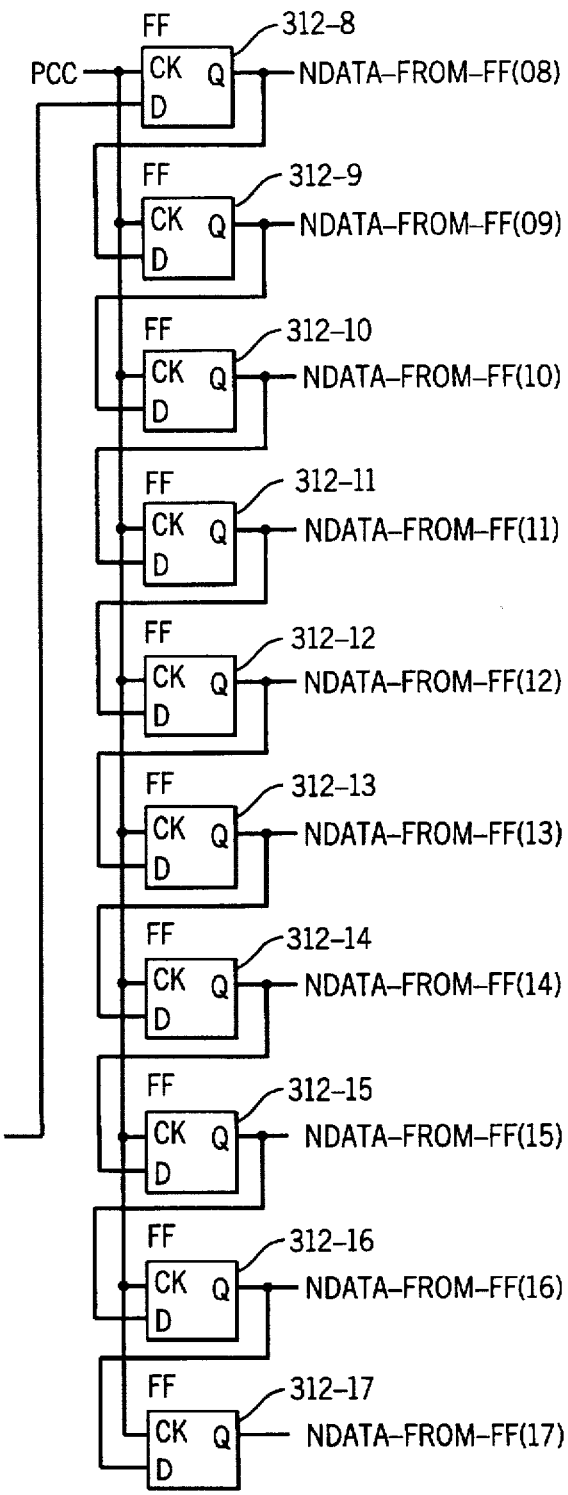
FIG. 16

DECODING UNIT AND STORAGE UNIT

BACKGROUND OF THE INVENTION

The present invention generally relates to decoding units and storage units, and more particularly to a decoding unit which is used when reproducing information from a recording medium that is recorded according to a mark edge recording system, and to a storage unit having such a decoding unit.

According to the conventional recording system, a central portion of a mark recorded on the recording medium indicates a data value. On the other hand, according to the mark edge recording system, an edge portion of the mark recorded on the recording medium indicates the data value. For this reason, the mark edge recording system can record information on the recording medium with a high density compared to the conventional recording system. The mark edge recording system is thus regarded as a recording system suited for optical disks such as magneto-optic disks.

For example, "Data Interchange on 90 mm Optical Disk Cartridges", ISO/IEC JTC 1/SC 23 N 705, 1.23.06 Draft 2 Dec. 1994 proposes a standard for recording and reproducing information to and from the optical disk in conformance with the mark edge recording system. A detailed description of this proposed standard will be omitted and this proposed standard will only be described briefly in this specification. According to this proposed standard, sectors of a logical tracks on the optical disk are numbered consecutively from 0, and a sector layout shown in FIGS. 1A through 1C is employed.

FIG. 1A shows a preformatted header of the sector, FIG. 1B shows a sector format for a case where user bytes are made up of 512 bytes, and FIG. 1C shows the sector format for a case where user bytes are made up of 2048 bytes. In FIGS. 1A through 1C, SM denotes a sector mark which indicates a start position of the sector, VFO1, VFO2 and VFO3 respectively denote VFO synchronizing fields, AM denotes an address mark which has a bit pattern that will not be generated in a run-length limited (RLL) code called RLL(1, 7), ID1 and ID2 respectively denote identification (ID) fields, PA denotes a postamble, PFH denotes a preformatted header, G denotes a gap, RF denotes a recording field, S denotes a synchronizing field, DF denotes a data field, B denotes a buffer field, and a number shown below each field indicates the number of bytes.

The RLL(1, 7) modulation code that is used in the above proposed standard is not easily affected by noise, and a large data detection margin can be obtained when reproducing the information from the optical disk. For these reasons, the proposed standard is more advantageous compared to the conventional system.

However, when the data recorded on the recording medium such as the optical disk are recorded in conformance with the mark edge recording system, a rising edge pulse and a falling edge pulse which are detected respectively move in different directions depending on a change in a slice level at the time of the data reproduction. As a result, an error is generated in the setting of the slice level in the form of jitter of the edge detection pulse.

In order to prevent the error in the setting of the slice level, it is conceivable to provide independent phase locked loop (PLL) circuits in a mark edge reproducing circuit for the rising edge side and the falling edge side, and to synthesize outputs on the rising edge side and the falling edge side after discrimination.

However, in a PLL discrimination circuit having two independent PLL circuits, there were problems in that two clocks having unstable phases must be synthesized with the correct phase, and that a clock slip of the PLL circuit caused by defects or the like must be corrected with respect to both PLL circuits.

SUMMARY OF THE INVENTION

Accordingly, it is a general object of the present invention to provide a novel and useful decoding unit and storage unit, in which the problems described above are eliminated.

Another and more specific object of the present invention is to provide a decoding unit which decodes data reproduced from a recording medium and obtained via first and second phase locked loop (PLL) means are the first and second PLL means mutually independent and oscillate at frequencies which are approximately the same. Further, the recording medium is recorded with pulse width modulation (PWM) data which are obtained by converting data encoded by a predetermined modulation code that generates a pattern having a D.C. component. Moreover, the decoding unit includes first storage means for successively storing a positive polarity data portion of the PWM data obtained via the first PLL means and a negative polarity data portion of the PWM data obtained via the second PLL means, first delay means for delaying the positive polarity data portion, second delay means for delaying the negative polarity data portion, second storage means for successively storing a delayed positive polarity data portion obtained via the first delay means and a delayed negative polarity data portion obtained via the second delay means, control means for controlling write and read timings of the first storage means and input and output timings of the first delay means in synchronism with a first clock obtained via the first PLL means, and for controlling a write timing of the second storage means and an input timing of the second delay means in synchronism with a second clock obtained via the second PLL means, where the control means controls a read timing of the second storage means and an output timing of the second delay means in synchronism with the first clock, and a decoder which decodes the data successively read from the first and second storage means. According to the decoding unit of the present invention, it is possible to accurately synthesize two data with respect to two PLL circuits of a PLL discriminating circuit which can realize a large slice level margin at the time of the data reproduction. In addition, it is possible to correct the clock slip by the two independent PLL circuits using the resynchronizing bytes. Therefore, it is possible to improve both the stability and reliability of the data reproduction.

Still another object of the present invention is to provide a storage unit including reproducing means for reproducing data from a recording medium which is recorded with pulse width modulation (PWM) data which are obtained by converting data encoded by a predetermined modulation code that generates a pattern having a D.C. component, first phase locked loop (PLL) means and second phase locked loop (PLL) means, supplied with the data reproduced by the reproducing means, where the first and second PLL means are mutually independent and oscillate at frequencies which are approximately the same, and a decoding unit which decodes data obtained via the first and second PLL means. The decoding unit comprises first storage means for successively storing a positive polarity data portion of the PWM data obtained via the first PLL means and a negative polarity data portion of the PWM data obtained via the second PLL means, first delay means for delaying the positive polarity data portion, second delay means for delaying the negative polarity data portion, second storage means for successively storing a delayed positive polarity data portion obtained via the first delay means and a delayed negative polarity data portion obtained via the second delay means, control means for controlling write and read timings of the first storage means and input and output timings of the first delay means in synchronism with a first clock obtained via the first PLL means, and for controlling a write timing of the second storage means and an input timing of the second delay means in synchronism with a second clock obtained via the second PLL means, where the control means controls a read timing of the second storage means and an output timing of the second delay means in synchronism with the first clock, and a decoder which decodes the data successively read from the first and second storage means. According to the storage unit of the present invention, it is possible to accurately synthesize two data with respect to two PLL circuits of a PLL discriminating circuit which can realize a large slice level margin at the time of the data reproduction. In addition, it is possible to correct the clock slip by the two independent PLL circuits using the resynchronizing bytes. Therefore, it is possible to improve both the stability and reliability of the data reproduction.

Other objects and further features of the present invention will be apparent from the following detailed description when read in conjunction with the accompanying drawings.

BRIEF DESCRIPTION OF THE DRAWINGS

FIGS. 1A, 1B and 1C respectively are diagrams for explaining a sector layout of a proposed standard;

FIG. 2 is a diagram for explaining conversion of input bits into channel bits;

FIG. 3 is a diagram for explaining a recording sequence within a data field when a sector is made up of 512 bytes and an error correction code employs 5-way interleave;

FIG. 4 is a diagram for explaining the recording sequence within the data field when the sector is made up of 2048 bytes and the error correction code employs 20-way interleave;

FIG. 16 is a system block diagram showing an embodiment of a NDATA shift register;

DESCRIPTION OF THE PREFERRED EMBODIMENTS

Figure 5:
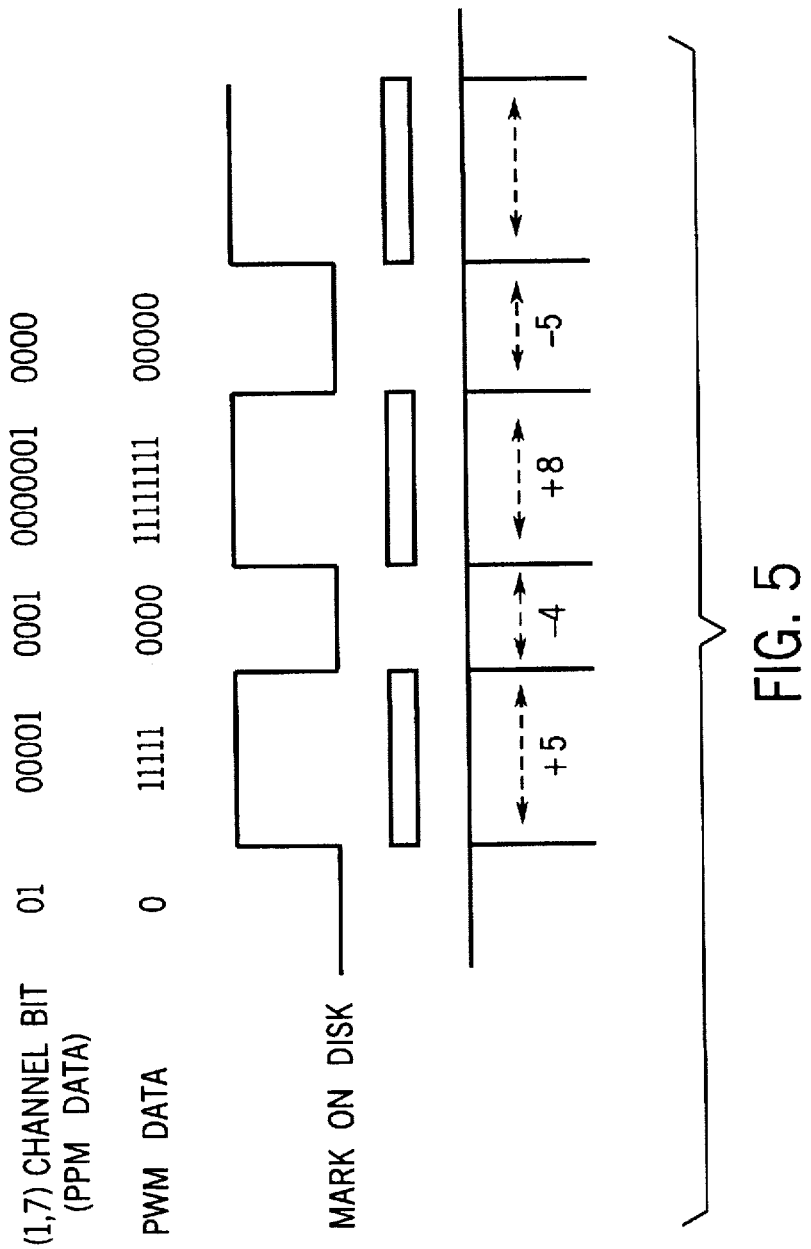
FIG. 5 is a diagram showing the relationship of PPM data, PWM data and marks recorded on an optical disk.

According to the proposed standard described above, the data field DF is made up of user data bytes to which the user can freely write data, cyclic redundancy check (CRC) bytes written with CRC codes which are used for error detection, error correction code (ECC) bytes written with ECCs which are used for error correction, and resynchronizing (hereinafter simply referred to as resync) bytes. The resync bytes are provided to prevent an error from spreading within the user data by carrying out resynchronization when a clock slip is generated within the data field DF due to a large defect or the like. The resync bytes have either of the following two resync patterns RSA and RSB respectively made up of channel bits amounting to 2 bytes, where X and Y are set to "0" or "1" based on an immediately preceding or an immediately subsequent data pattern. The two kinds of resync patterns RSA and RSB will not be generated in the RLL(1, 7) modulation code.
RSA: 0X0 100 000 001 000 000 100 00Y
RSB: 0X0 100 000 001 000 000 101 00Y The RLL(1, 7) modulation code which is used to record all data on the formatted regions on the optical disk is defined as shown in FIG. 2. FIG. 2 shows a case where input bits are converted into channel bits, where "not 00" indicates "01", "10" or "11", and "X" indicates a value "0" or "1". The RLL(1, 7) modulation coding is started from a first bit of a first byte of the field which is to be converted, and after the resync region, the coding is resumed from the last 2 input bits of the resync bytes.

Figure 4:
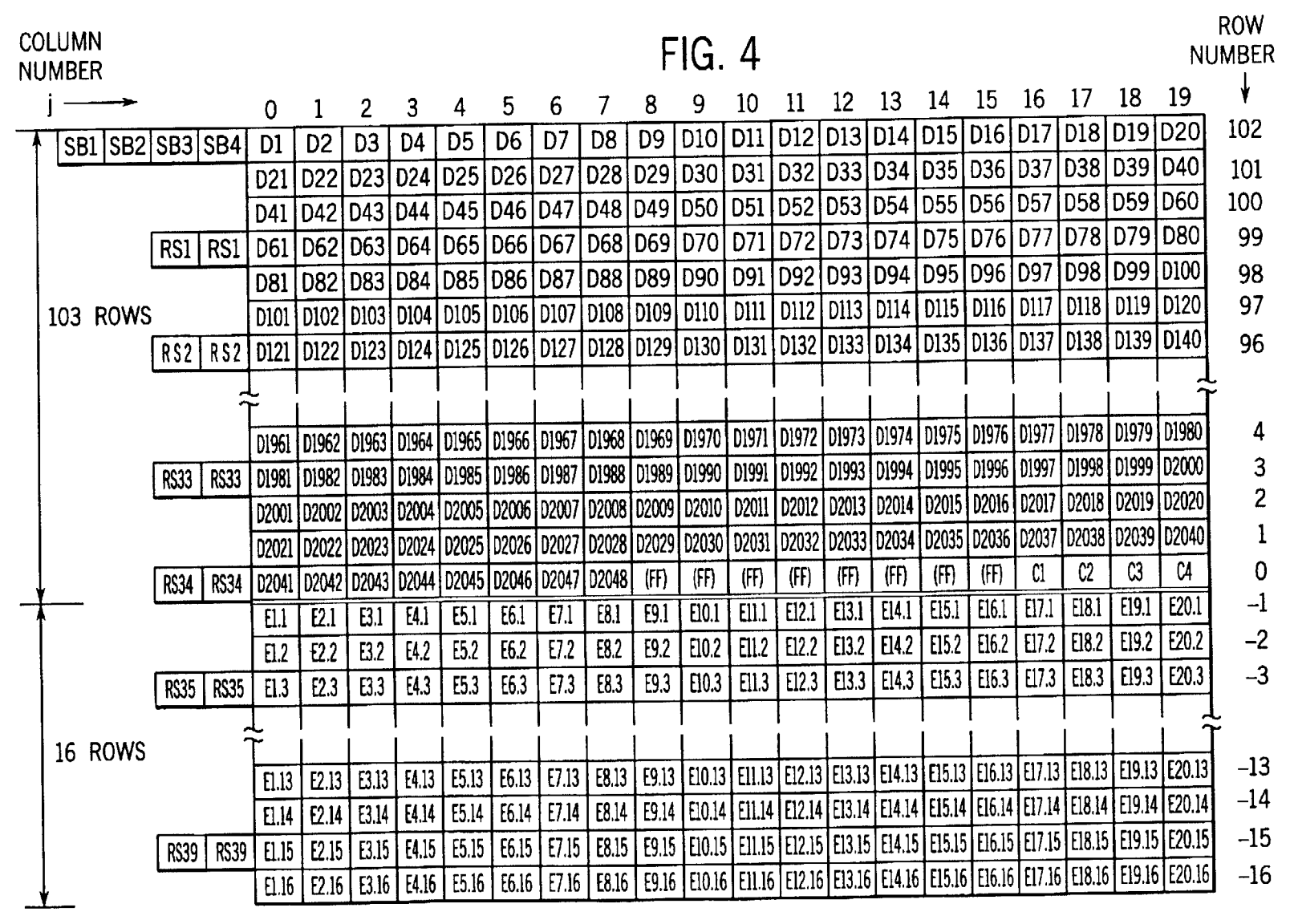

The recording within the data field DF is carried out in the sequence shown in FIGS. 3 and 4. FIG. 3 shows a case where the sector is made up of 512 bytes and the ECC employs the 5-way interleave. On the other hand, FIG. 4 shows a case where the sector is made up of 2048 bytes and the ECC employs the 20-way interleave. In FIGS. 3 and 4, the recording is made from the left to right and from the top to bottom. In addition, in FIGS. 3 and 4, SB denotes a synchronizing byte, D denotes a user byte, RS denotes a resync byte, C denotes a check byte for CRC, E denotes a check byte for ECC, and Fm denotes a FF byte.

Accordingly, in the case shown in FIG. 3, the first 104 lines include the user bytes in columns 0 through 4, 4 FF bytes and 4 check bytes for CRC, and the next 16 lines include only the check bytes for ECC. On the other hand, in the case shown in FIG. 4, the first 103 lines include the user bytes in columns 0 through 19, 8 FF bytes and 4 check bytes for CRC, and the next 16 lines include only the check bytes for ECC.

According to the proposed standard described above, the total number of "1"s in the resync pattern can be switched from an odd number to an even number or vice versa, so as to minimize the D.C. level fluctuation of the data pattern in the data field within the sector. In other words, one of the two kinds of resync patterns RSA and RSB which can suppress the D.C. level fluctuation to a minimum value is selected.

The resync pattern to be used is determined as follows. First, the channel bits represented by pulse position modulation (PPM) data are converted into pulse width modulation (PWM) data so as to simplify the process. For example, if the PPM data is ". . . 0010100010010 . . . ", this PPM data is converted into the PWM data ". . . 0011000011100 . . . ". Next, the logic value "0" of the PWM data is regarded as "−1", the logic value "1" of the PWM data is regarded as "+1", and a digital sum value (DSV) is calculated. This DSV is a difference between the total number of logic value "1"s of the PWM data and the total number of logic value "0"s of the PWM data. FIG. 5 shows the relationship of the PPM data, the PWM data and the marks recorded on the optical disk for this case. In this case, a DSVm is calculated from DSVm=(+5−4+8−5 . . . ). When this DSVm is a minimum at the time of the recording of the information onto the optical disk, it is possible to suppress the D.C. level fluctuation of the data pattern to the minimum value.

The resync region is divided into two portions (RS∥INV), and the two divided portions are defined by the PPM data according to the following formulas.

RS=0X010000000100000010
INV=000Y(INV1) or 100Y(INV2)

In addition, the user data can be defined by the following formula when m=1 to N, N=39 in the case of the sector made up of 1024 bytes, and N=30 in the case of the sector made up of 512 bytes.

VFO∥SYNC∥B0∥RS1∥INV1 (OR INV2)∥B1∥RS2∥. . . ∥INV1 (OR INV2)∥Bm∥RSm+1∥. . . ∥INV1(OR INV2)∥BN

A function DSV(z) is defined such that an argument (z) which is a PPM data stream becomes the PWM DSV sum based on the last PWM state of the PWM data immediately preceding the data in the argument (z).

In addition, INV1 and INV2 are selected in m steps using the following algorithms.

P0=DSV(VFO3∥SYNC∥B0∥RS1)
Pm=Pm−1+DSV(INV1∥Bm∥RSm+1) Or
Pm=Pm−1+DSV(INV2∥Bm∥RSm+1)
Select INV1 or INV2 to minimize |Pm|
PN=PN−1+DSV(INV1∥BN) Or
PN=PN−1+DSV(INV2∥BN)
Select INV1 or INV2 to minimize |PN|

When it is assumed that N=39 in the case of the sector made up of 1024 bytes, and N=30 in the case of the sector made up of 512 bytes, the process according to the above algorithms is repeated for m=1 to N. When |Pm| becomes the same value for the resync patterns RSA and RSB, the first resync pattern RSA of the two resync patterns RSA and RSB is selected.

As described above, when converting the RLL(1, 7) modulation code into the PWM data, the "1" portion and the "0" portion of the PWM data in the subsequent data block are reversed depending on the number of "1"s included in the resync pattern of the resync byte between two data blocks. Accordingly, in the proposed standard, it is possible to effectively utilize this nature to minimize the D.C. level fluctuation of the data pattern in the data field within the sector.

For example, in the case of a repeating pattern of "596" in NRZ data, that is, a pattern ". . . 0101000000101000000101000000101000000 . . . " which is a repeating pattern of a pattern 1T/6T in the RLL(1, 7) modulation code, it is possible to effectively suppress the D.C. level fluctuation of the data pattern by inverting the PWM data at the resync byte portion.

Figure 6:
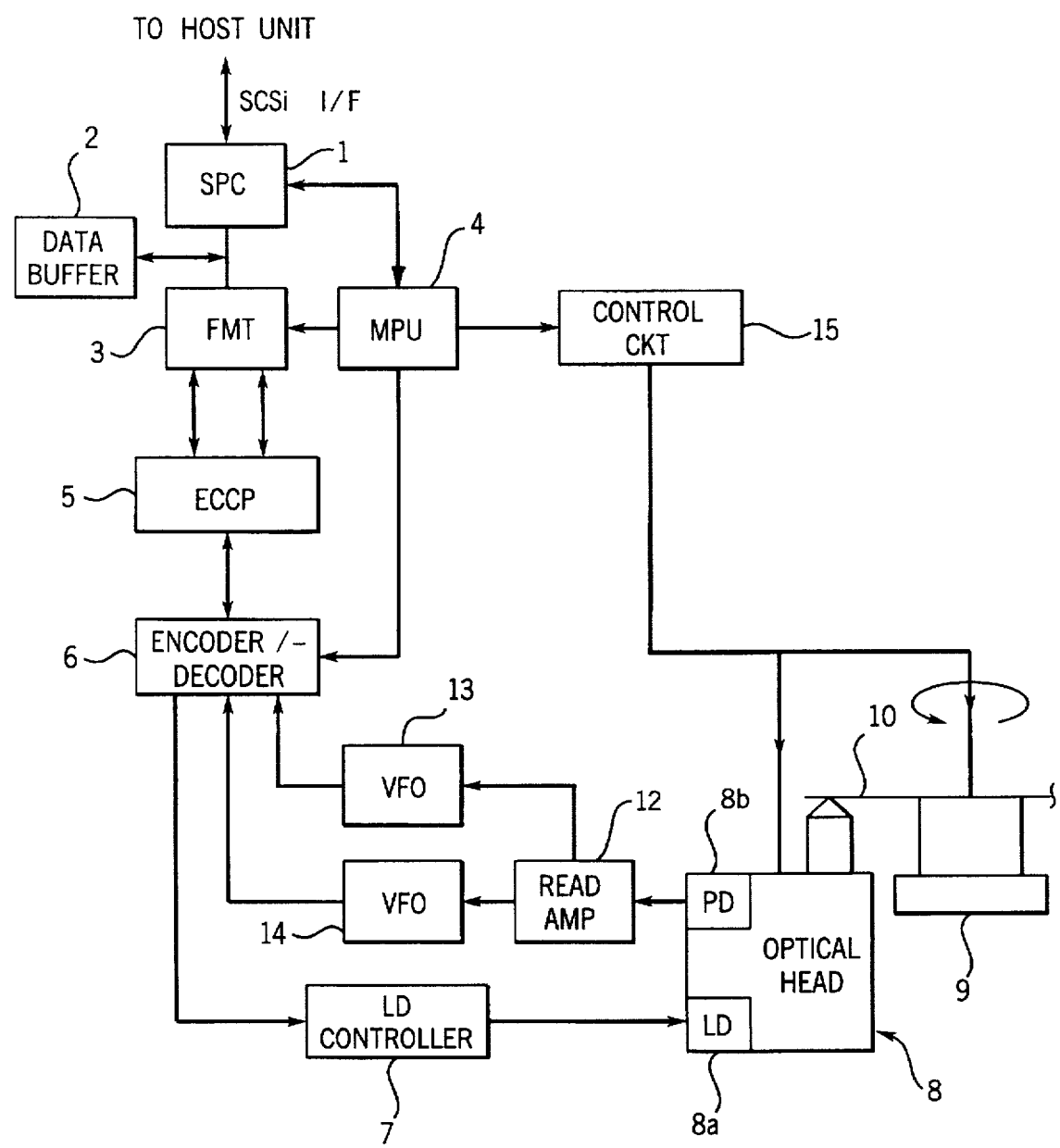
FIG. 6 is a system block diagram showing the general construction of an embodiment of a storage unit according to the present invention.

FIG. 6 shows the general construction of an embodiment of a storage unit according to the present invention. In this embodiment, the present invention is applied to an optical disk unit. The optical disk unit shown in FIG. 6 generally includes a SCSI protocol controller (SPC) 1, a data buffer 2, a formatter (FMT) 3, a microprocessor unit (MPU) 4, an ECC processor (ECCP) 5, an encoder/decoder 6, a laser diode (LD) controller 7, an optical head 8 which includes a laser diode (LD) 8a and a photodiode (PD) 8b, a spindle motor 9 which rotates an optical disk 10, a read amplidier 12, VFO (PLL) circuits 13 and 14, and a control circuit 15 which are connected as shown.

The SPC 1 is coupled to a host unit (not shown) such as a personal computer and a work station via a SCSI interface, and controls the SCSi protocol. The SPC 1 transfers data from the host unit to the data buffer 2, and transfers data from the data buffer 2 to the host unit. The MPU 4 instructs a data transfer by analyzing a command from the SPC 1, and controls various driving parts of the optical disk unit such as a head driving part (not shown) and a spindle motor driving part (not shown) via the control circuit 15 so that the optical head 8 scans a desired recording position on the optical disk 10. In addition, the MPU 4 controls the FMT 3 so as to transmit data which are within the data buffer 2 and are to be recorded on the optical disk 10. The ECCP 5 adds the ECC to the data which are to be recorded on the optical disk 10.

The encoder/decoder 6 encodes the data received via the ECCP 5, and controls a LD current which is supplied to the laser diode 8a of the optical head 8 via the LD controller 7. The encoding process includes two encoding stages, and the data are first encoded into the RLL(1, 7) modulation codes, and the RLL(1, 7) modulation codes are then encoded (or converted) into the PWM data. A laser beam emitted from the laser diode 8a is irradiated on the optical disk 10, thereby recording marks indicative of the data on the optical disk 10.

On the other hand, the laser beam which is received by the photodiode 8b of the optical head 8 via the optical disk 10 is converted into a current, and this current is amplified and converted into a binary signal in the read amplifier 12 before being supplied to the VFO circuits 13 and 14. Reproduced data and clocks output from the mutually independent VFO circuits 13 and 14 which oscillate at frequencies that are approximately the same are decoded by the encoder/decoder 6. The data output from the VFO circuits 13 and 14 respectively are the positive polarity data portion and the negative polarity data portion of the PWM data, and the clocks corresponding to the positive polarity data portion and the negative polarity data portion are respectively output from the VFO circuits 13 and 14. Accordingly, the positive polarity data portion and the negative polarity data portion respectively output from the VFO circuits 13 and 14 are asynchronous (or non-synchronous).

The storage unit according to the present invention is characterized by the encoder/decoder 6 shown in FIG. 6, and known circuits or the like may be used for the parts other than the encoder/decoder 6. For example, a part made up of the SPC 1, the FMT 3 and the ECCP 5 may be realized by a semiconductor chip MB86506, and the MPU 4 may be realized by a semiconductor chip 68302.

Figure 7:
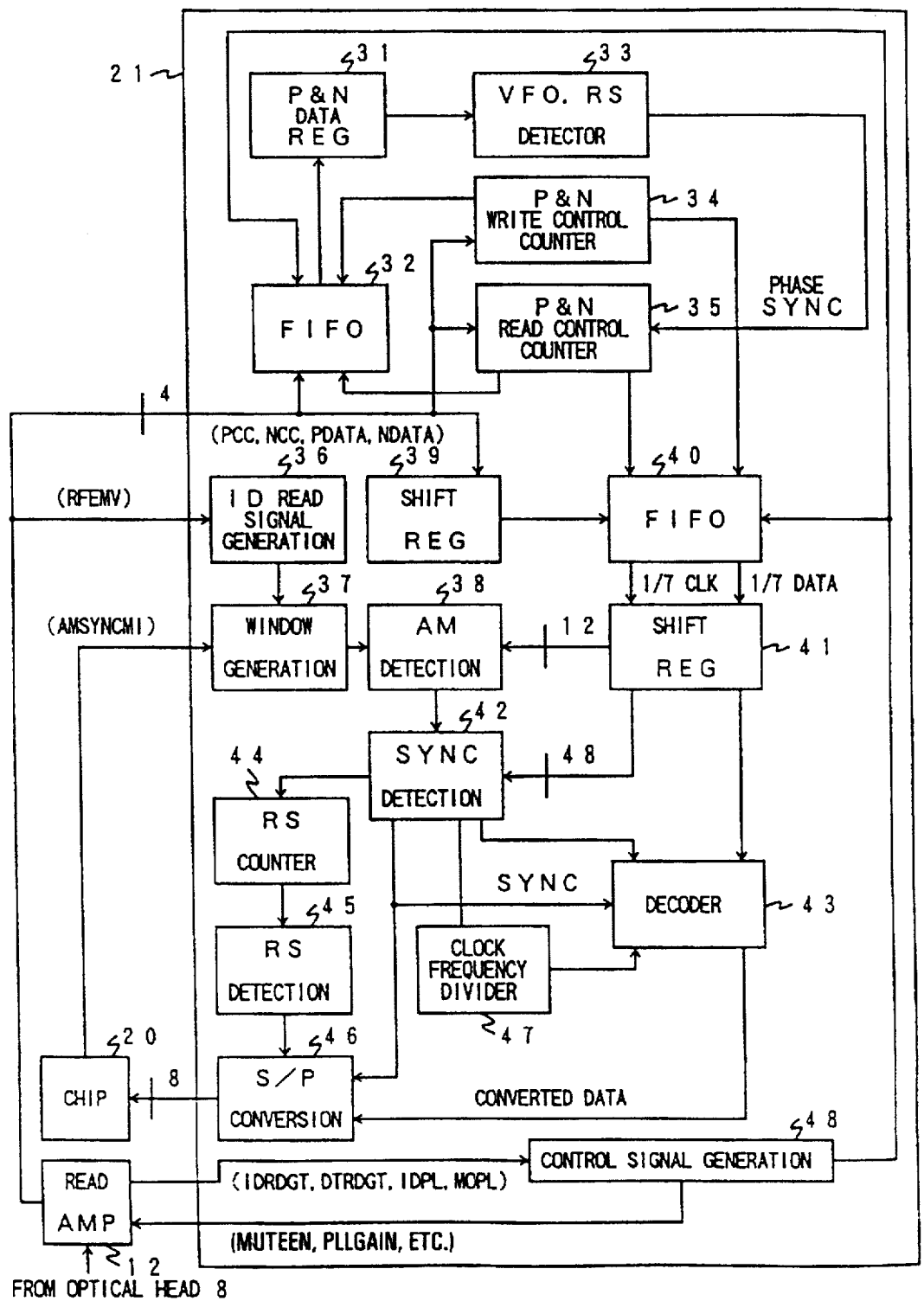
FIG. 7 is a system block diagram showing an embodiment of an encoder/decoder.

FIG. 7 shows an embodiment of the encoder/decoder 6. In FIG. 7, a semiconductor chip 20 corresponds to the semiconductor chip MB86506, and a semiconductor chip 21 corresponds to a decoder portion of the encoder/decoder 6 shown in FIG. 6. The semiconductor chip 21 corresponds to an embodiment of a decoding unit according to the present invention.

For the sake of convenience, it is assumed in FIG. 7 and FIG. 8 which will be described later that a read amplifier part 12A includes the read amplifier 12 and the VFO circuits 13 and 14 shown in FIG. 6.

In FIG. 7, the semiconductor chip 21 includes a P & N data register part 31, a first-in-first-out (FIFO) part 32 for phase synchronization or data correction, VFO & resync pattern (RS) detector part 33, P & N data write control counter part 34, a P & N data read control counter part 35, an identification (ID) read signal generation circuit 36, a window generation circuit 37, an address mark (AM) detection circuit 38, a shift register part 39, a FIFO part 40 for RLL(1, 7) decoding, a shift register part 41, a sync field (SYNC) detection circuit 42, a RLL(1, 7) decoder 43, a RS counter 44, a RS detection circuit 45, a serial-to-parallel (S/P) conversion circuit 46, a clock frequency divider 47, and a control signal generation circuit 48 which are connected as shown.

The positive polarity data portion (hereinafter referred to as a data portion PDATA) of the PWM data, the negative polarity data portion (hereinafter referred to as a data portion NDATA) of the PWM data, a clock PCC with respect to the data portion PDATA, a clock NCC with respect to the data portion NDATA, and an amplitude detection signal RFENV are output from the read amplifier part 12A based on a reproduced signal from the optical head 8 shown in FIG. 6. The data portion PDATA and the clocks PCC and NCC are supplied to the FIFO part 32. On the other hand, the clocks PCC and NCC are also supplied to P & N data write control counter part 34 and the P & N data read control counter part 35. In addition, the data portions PDATA and NDATA and the clocks PCC and NCC are also supplied to the shift register part 39. The amplitude detection signal REFNV is supplied to the ID read signal generation circuit 36.

A read signal IDRDGT of the ID portion, a read signal DTRDGT of the magneto-optic (MO) portion, an ID pulse IDPL, and a MO pulse MOPL are also output from the read amplifier part 12A and are supplied to the control signal generation circuit 48. The control signal generation circuit 48 generates various control signals based on these signals received from the read amplifier part 12A. The control signal generation circuit 48 outputs a mute enable signal MUTEEN, a PLL gain control signal PLLGAIN and the like with respect to the read amplifier part 12A. The control signal generation circuit 48 also generates a FIFO enable signal and supplies this FIFO enable signal to the FIFO part 32.

The window generation circuit 37 receives from the semiconductor chip 20 a signal AMSYNCWI which indicates windows with respect to the AM and the SYNC.

Figure 8:
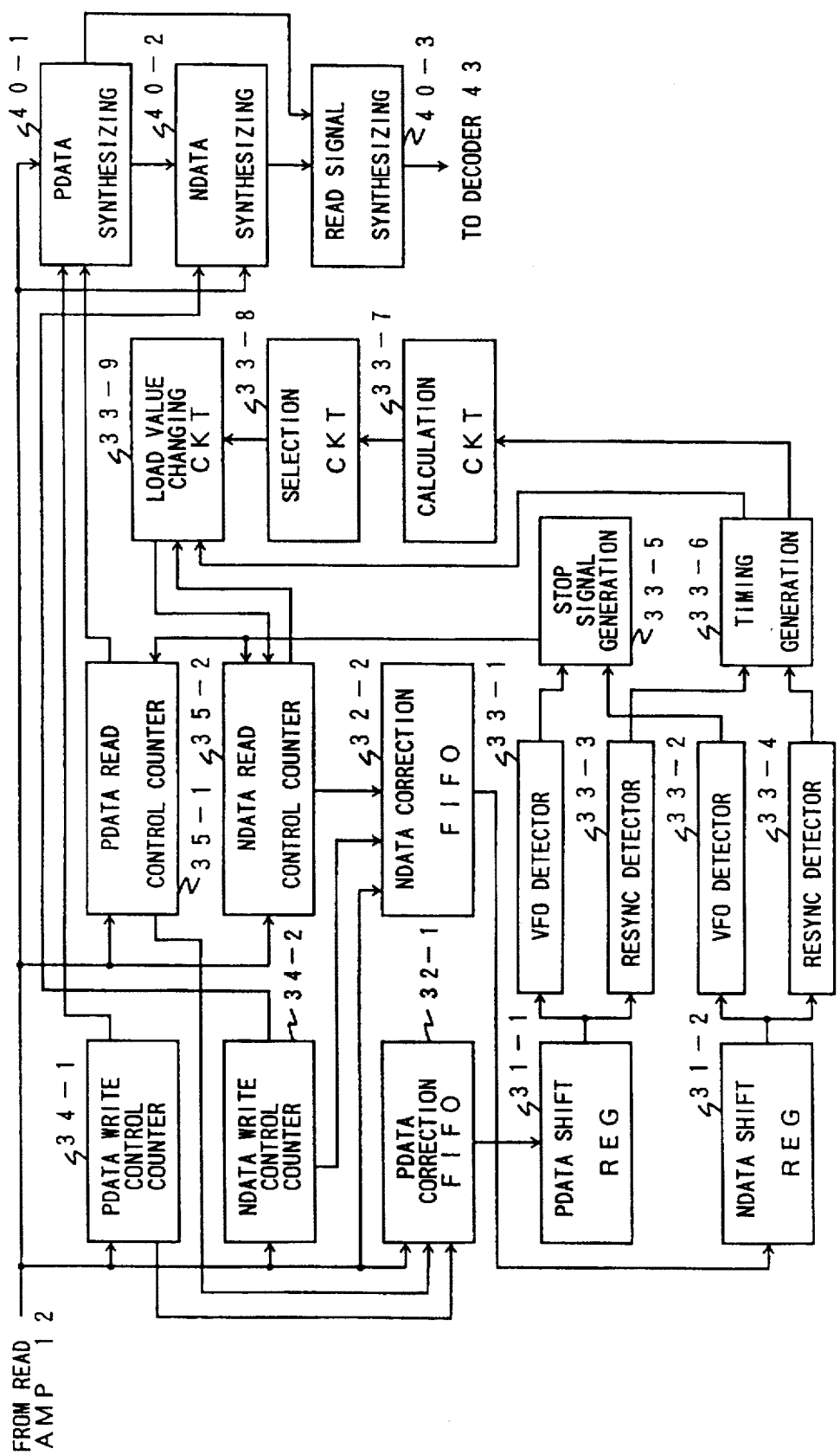
FIG. 8 is a system block diagram showing a portion of the encoder/decoder shown in FIG. 7 in more detail.

FIG. 8 shows a portion corresponding to the elements 31 through 35 and 39 through 41 shown in FIG. 7 in more detail. In FIG. 8, a PDATA shift register 31-1 and a NDATA shift register 31-2 correspond to the P & N shift register part 31. A PDATA correction FIFO 32-1 and a NDATA correction FIFO 32-2 correspond to the FIFO part 32. A VFO detector 33-1 for detecting the VFO of the data portion PDATA, a VFO detector 33-2 for detecting the VFO of the data portion NDATA, a RS detector 33-3 for detecting the RS of the data portion PDATA, a RS detector 33-4 for detecting the RS of the data portion NDATA, a stop signal generation circuit 33-5, a timing generation circuit 33-6, a calculation circuit 33-7, a selection circuit 33-8 and a load value changing circuit 33-9 correspond to the VFO & RS detector part 33. A PDATA write control counter 34-1 and a NDATA write control counter 34-2 correspond to the P & N write control counter part 34. A PDATA read control counter 35-1 and an NDATA read control counter 35-2 correspond to the P & N read control counter part 35. Furthermore, a part made up of a PDATA synthesizing part 40-1, an NDATA synthesizing part 40-2 and a read signal synthesizing part 40-3 corresponds to a part which is made up of the shift register part 39, the FIFO part 40 and the shift register part 41.

The PDATA shift register 31-1 successively shifts the data portion PDATA and supplies shifted data portion PDATA to the VFO detector 33-1 and the RS detector 33-3 so as to detect the VFO and the RS from the data portion PDATA. Similarly, the NDATA shift register 31-2 successively shifts the data portion NDATA and supplies shifted data portion NDATA to the VFO detector 33-2 and the RS detector 33-4 so as to detect the VFO and the RS from the data portion NDATA. The VFO detection results from the VFO detectors 33-1 and 33-2 are supplied to the stop signal generation circuit 33-5, and the RS detection results are supplied from the RS detectors 33-3 and 33-4 to the timing generation circuit 33-6. The stop signal generation circuit 33-5 generates the window of the VFO based on the VFO detection results, and generates a stop signal which stops the read control in response to the VFO detection. The stop signal is supplied to the read control counters 35-1 and 35-2. The timing generation circuit 33-6 generates a latch signal which latches the RS, a timing signal which indicates a load value generation timing when correcting the NDATA read control counter 35-2, and a timing signal which indicates a reload timing, in response to the RS detection. The latch signal is supplied to the calculation circuit 33-7, and the timing signals are supplied to the load value changing circuit 33-9.

The calculation circuit 33-7 uses the latch signal with respect to the RS (hereinafter referred to as P-RS) of the data portion PDATA and the RS (hereinafter referred to as N-RS) of the data portion NDATA, and calculates an error quantity for the case where the generation timing of the N-RS is earlier than that of the P-RS and an error quantity for the case where the generation timing of the N-RS is later than that of the P-RS. The selection circuit 33-7 judges whether the generation timing of the N-RS is earlier or later than that of the P-RS, and selects the error quantity for the case where the generation timing of the N-RS is earlier if judged earlier and selects the error quantity for the case where the generation timing of the N-RS is later if judged later. The selected error quantity is supplied to the load value changing circuit 33-9. The load value changing circuit 33-9 adds the error quantity of the generation timing of the N-RS with respect to the P-RS to a counted value of the NDATA read control counter 35-2, and changes the load value of the NDATA read control counter 35-2 to the added result.

The PDATA write control counter 34-1 counts the clock PCC from the read amplifier part 12A, and supplies a counted value to the PDATA correction FIFO 32-1 and the PDATA synthesizing part 40-1. The data portion PDATA from the read amplifier part 12A is supplied to the PDATA correction FIFO 32-1 and the PDATA synthesizing part 40-1. On the other hand, the NDATA write control counter 34-2 counts the clock NCC from the read amplifier part 12A, and supplies a counted value to the NDATA correction FIFO 32-2 and the NDATA synthesizing part 40-2. The data portion NDATA from the read amplifier part 12A is supplied to the NDATA correction FIFO 32-2 and the NDATA synthesizing part 40-2.

The PDATA read control counter 35-1 counts the clock PCC from the read amplifier part 12A, and supplies a counted value to the PDATA correction FIFO 32-1 and the PDATA synthesizing part 40-1. On the other hand, the NDATA read control counter 35-2 counts the clock NCC from the read amplifier part 12A, and supplies the counted value to the NDATA correction FIFO 32-2 and the load value changing circuit 33-9.

The PDATA synthesizing part 40-1 includes a shift register for delaying the data portion PDATA, and a PDATA synthesizing FIFO for synthesizing the data portion PDATA. The NDATA synthesizing part 40-2 includes a shift register for delaying the data portion NDATA, and a NDATA synthesizing FIFO for synthesizing the data portion NDATA. the read signal synthesizing part 40-3 synthesizes the signals read from the PDATA and NDATA synthesizing FIFOs of the PDATA and NDATA synthesizing parts 40-1 and 40-2, and supplies synthesized data to the decoder 43 shown in FIG. 7.

Figure 19:
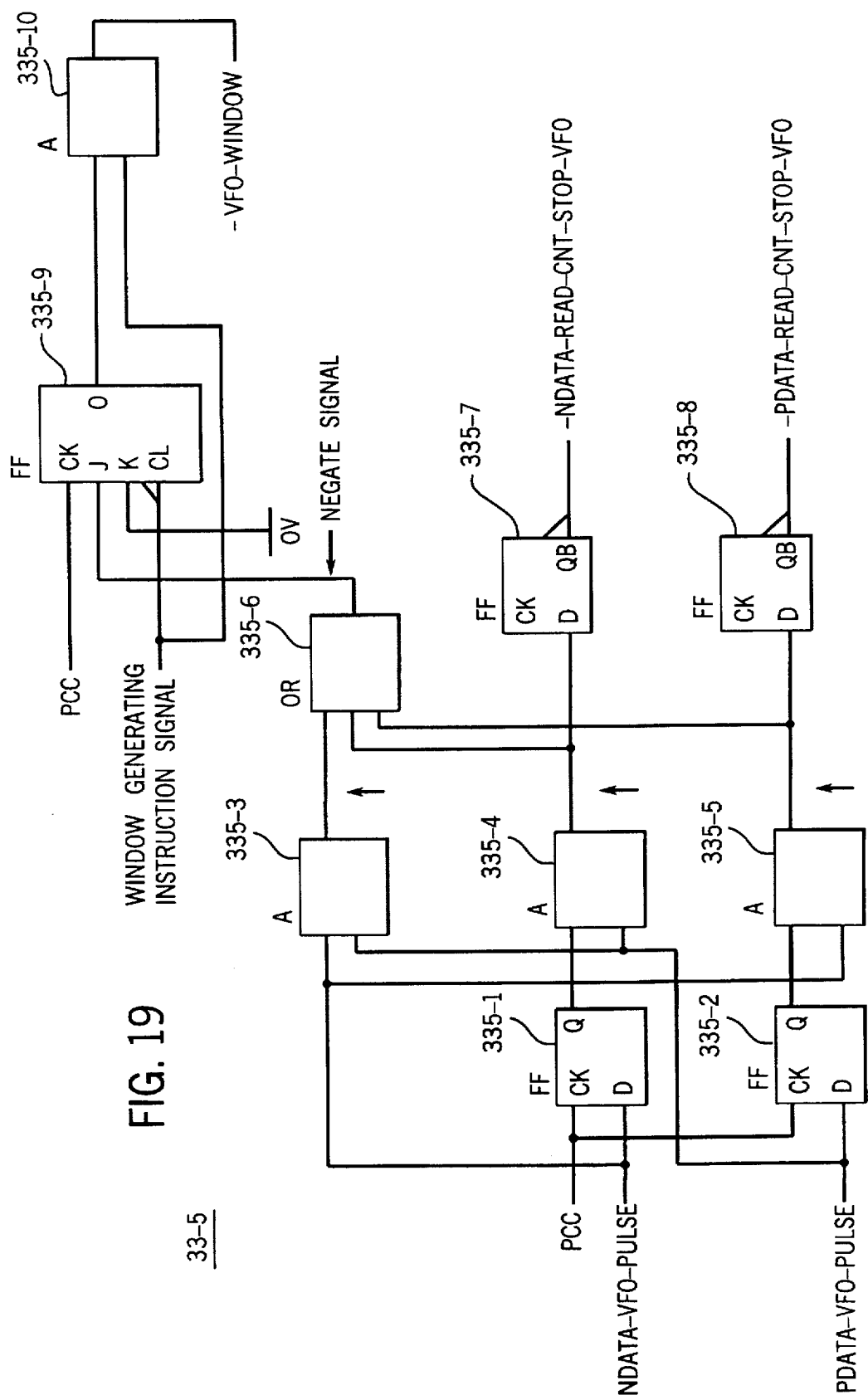
FIG. 19 is a system block diagram showing an embodiment of a stop signal generation circuit.
Figure 20:
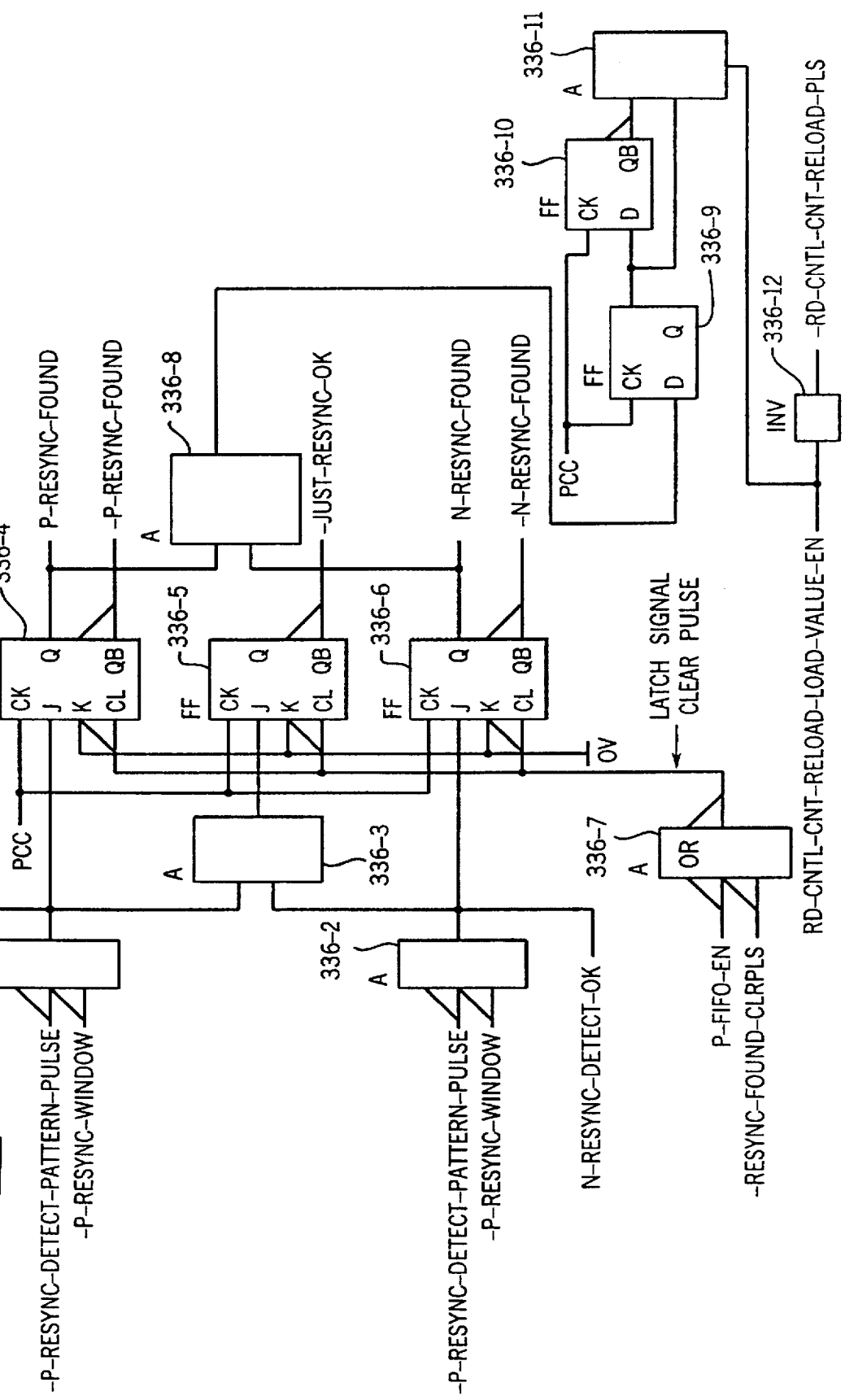
FIG. 20 is a system block diagram showing an embodiment of a timing generation circuit.
Figure 21:
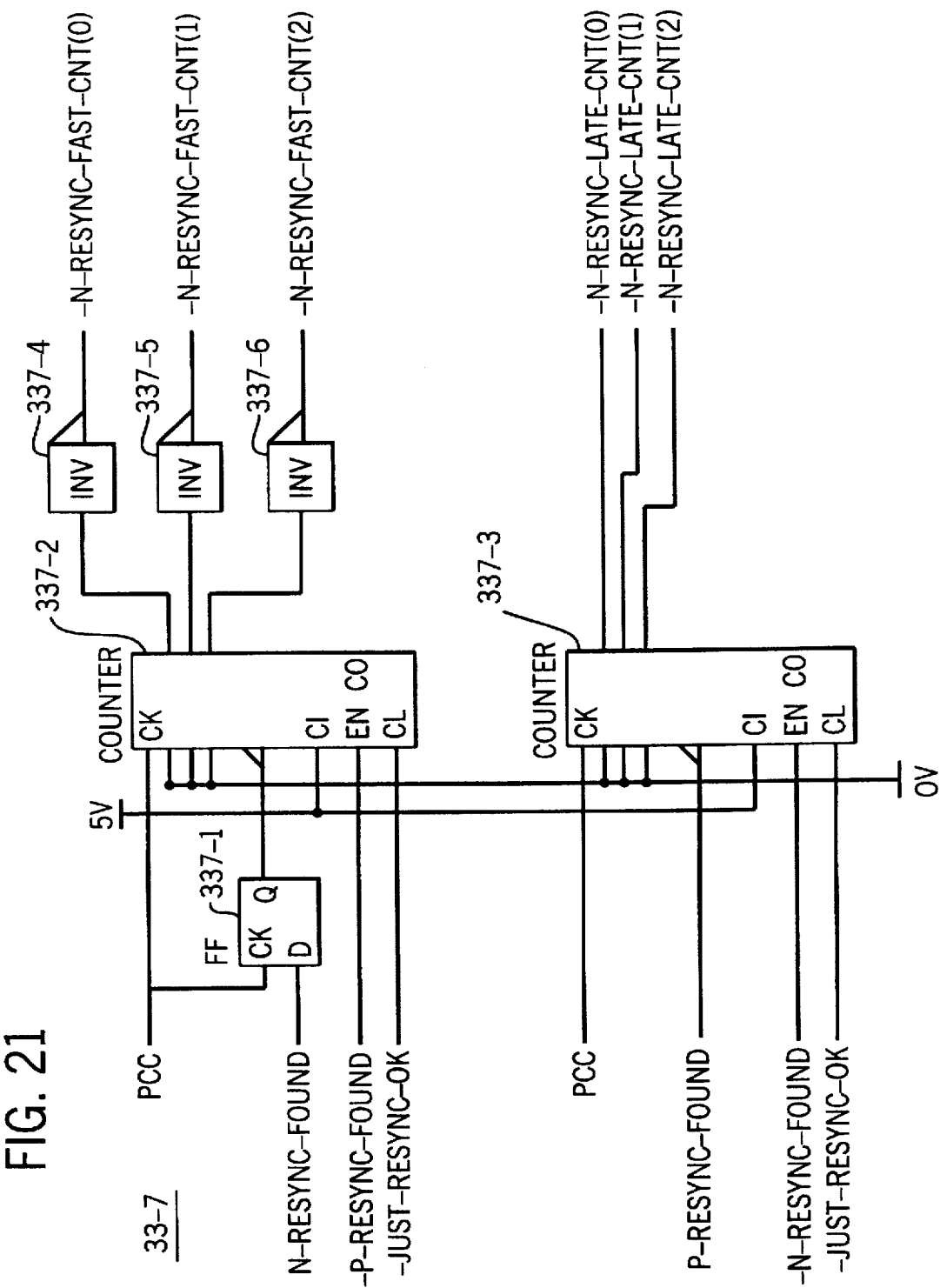
FIG. 21 is a system block diagram showing an embodiment of a calculation circuit.
Figure 22:
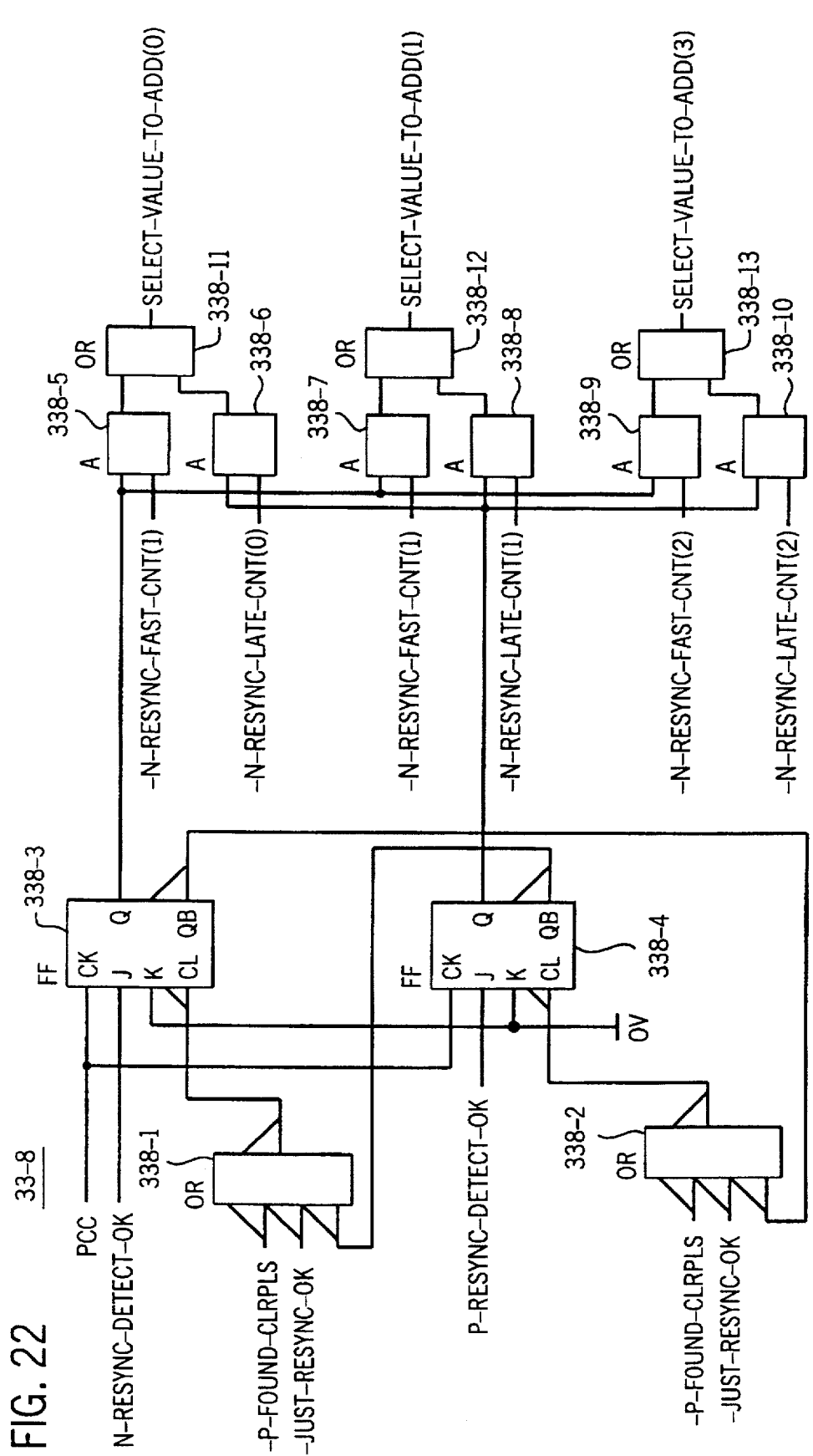
FIG. 22 is a system block diagram showing an embodiment of a selection circuit.
Figure 23:
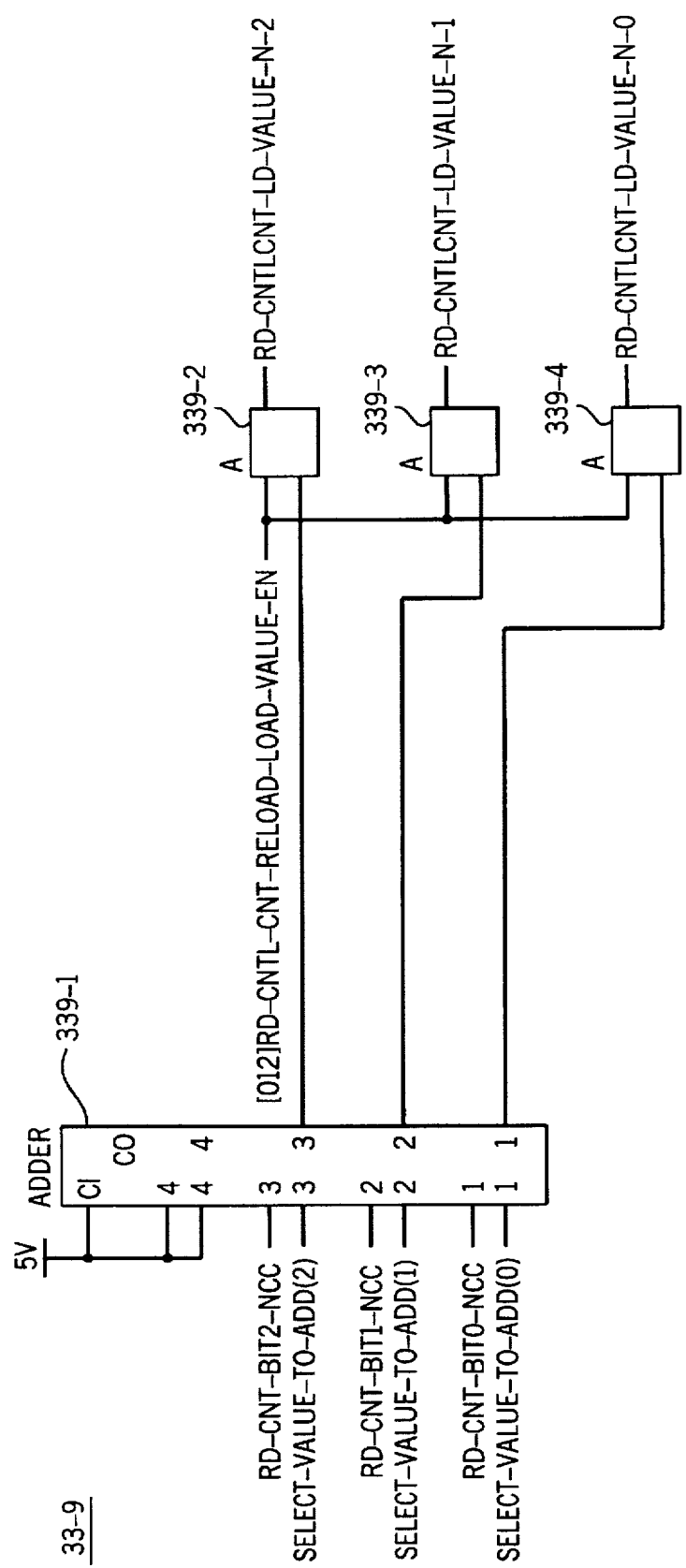
FIG. 23 is a system block diagram showing an embodiment of a load value changing circuit.
Figure 24:
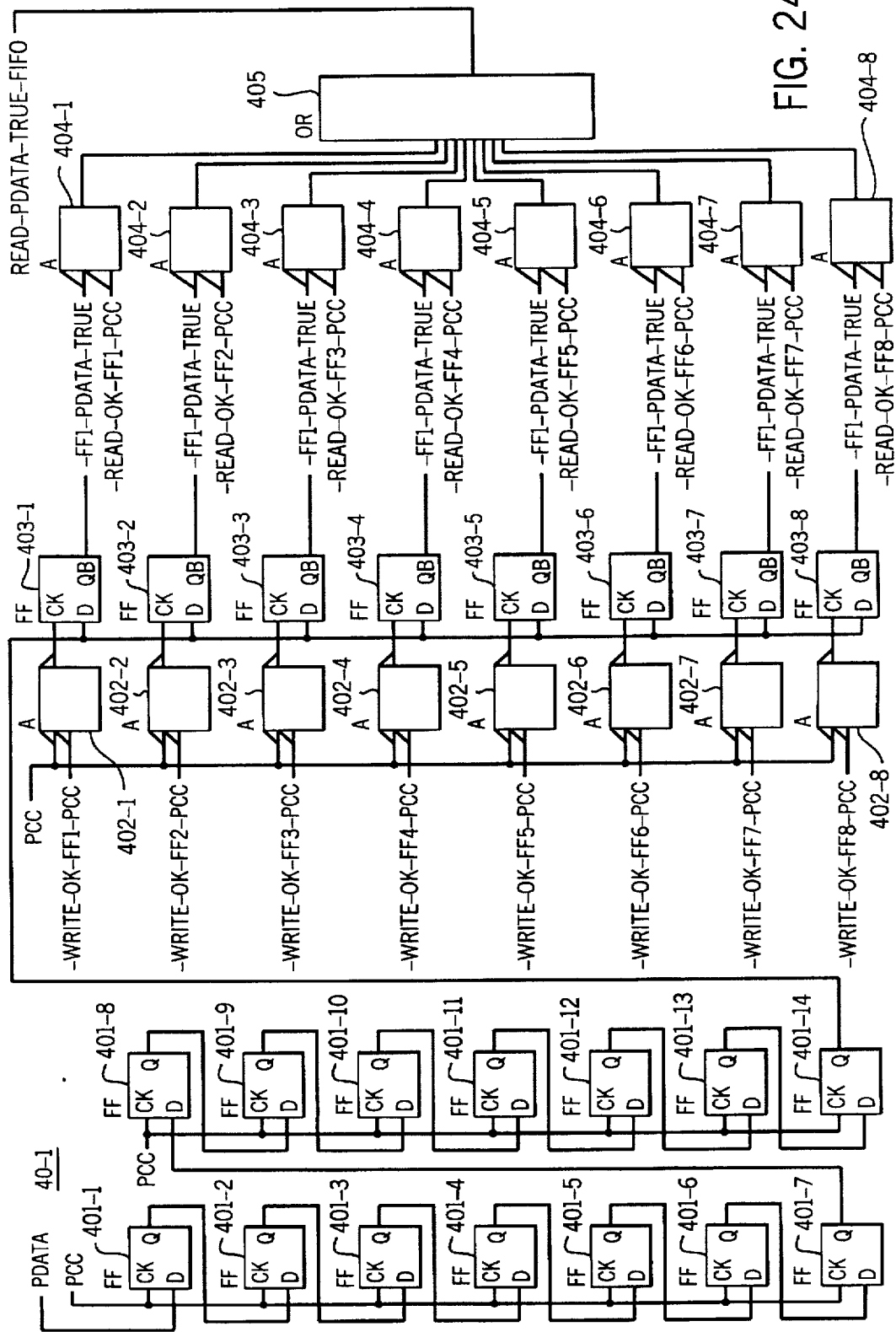
FIG. 24 is a system block diagram showing an embodiment of a PDATA synthesizing part.
Figure 25:
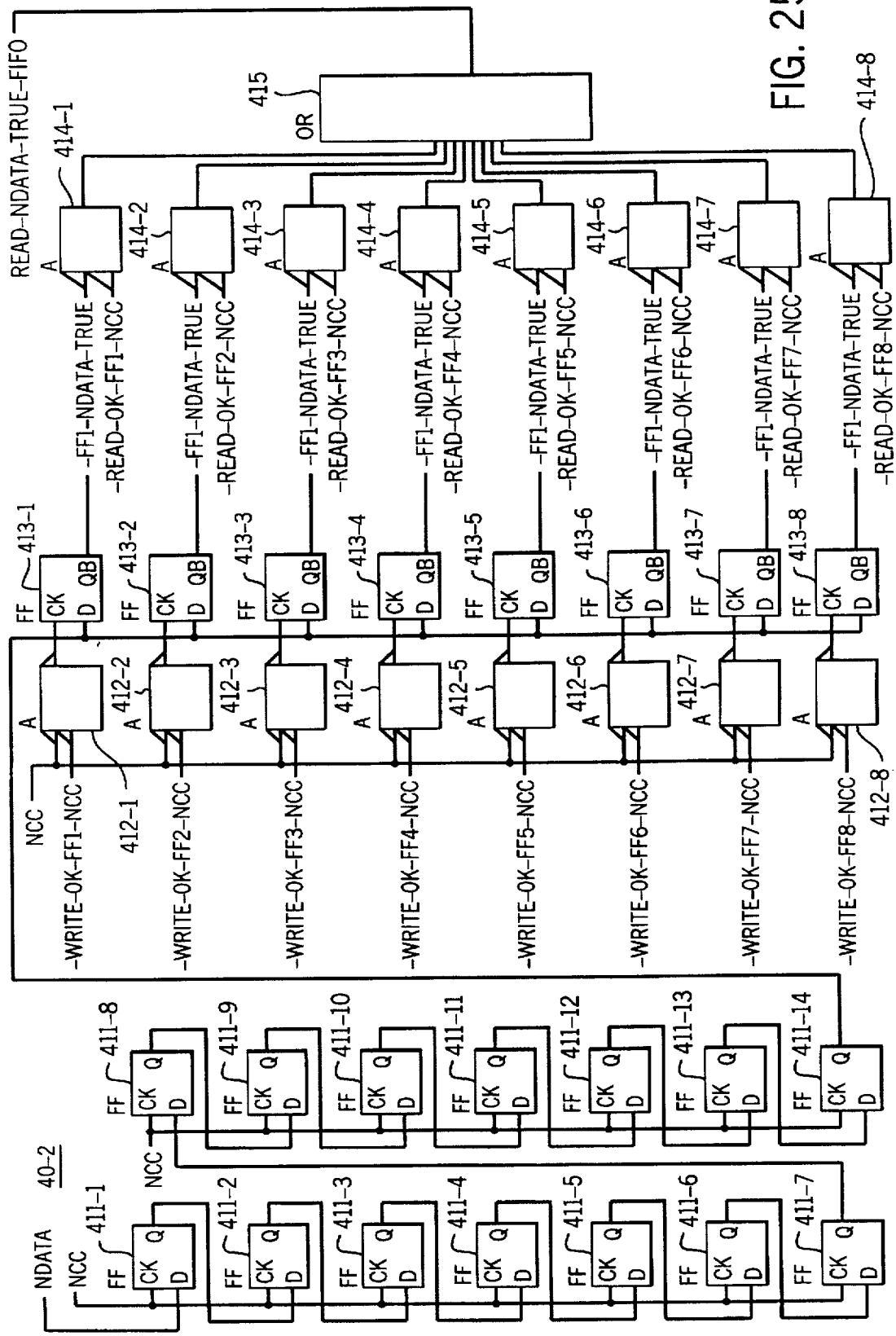
FIG. 25 is a system block diagram showing an embodiment of a NDATA synthesizing part.
Figure 26:
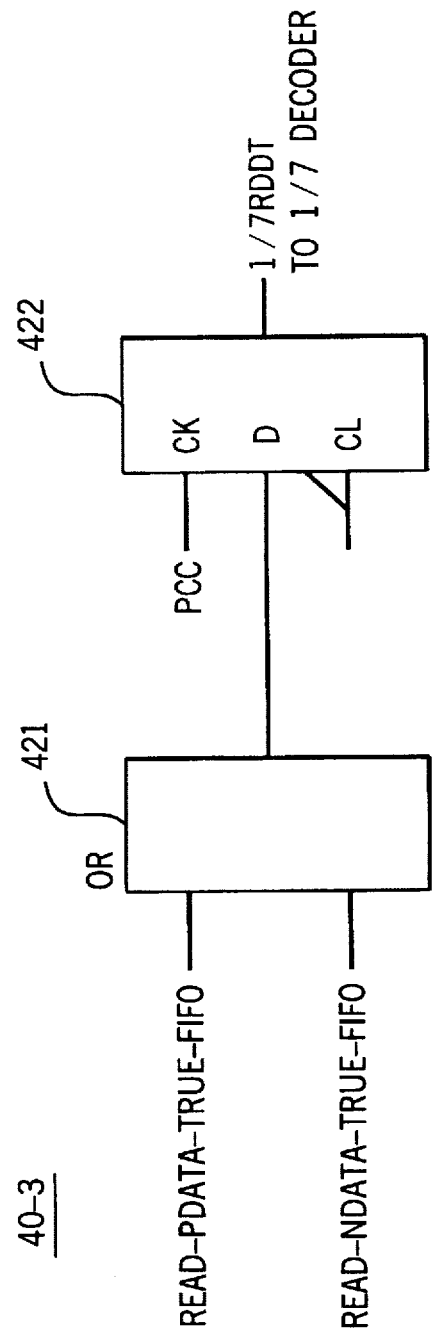
FIG. 26 is a system block diagram showing an embodiment of a read signal synthesizing part.

Next, each part of FIG. 8 will be described in more detail by referring to FIGS. 9 through 26. FIGS. 9 through 13 show circuit parts provided with respect to the data portion PDATA, and FIGS. 14 through 18 show circuit parts provided with respect to the data portion NDATA. FIG. 19 shows the stop signal generation circuit 33-5, and FIG. 20 shows the timing generation circuit 33-6. FIG. 21 shows the calculation circuit 33-7, and FIG. 22 shows the selection circuit 33-8. FIG. 23 shows the load value changing circuit 33-9, and FIG. 24 shows the PDATA synthesizing part 40-1. FIG. 25 shows the NDATA synthesizing part 40-2, and FIG. 26 shows the read signal synthesizing part 40-3.

Figure 9:
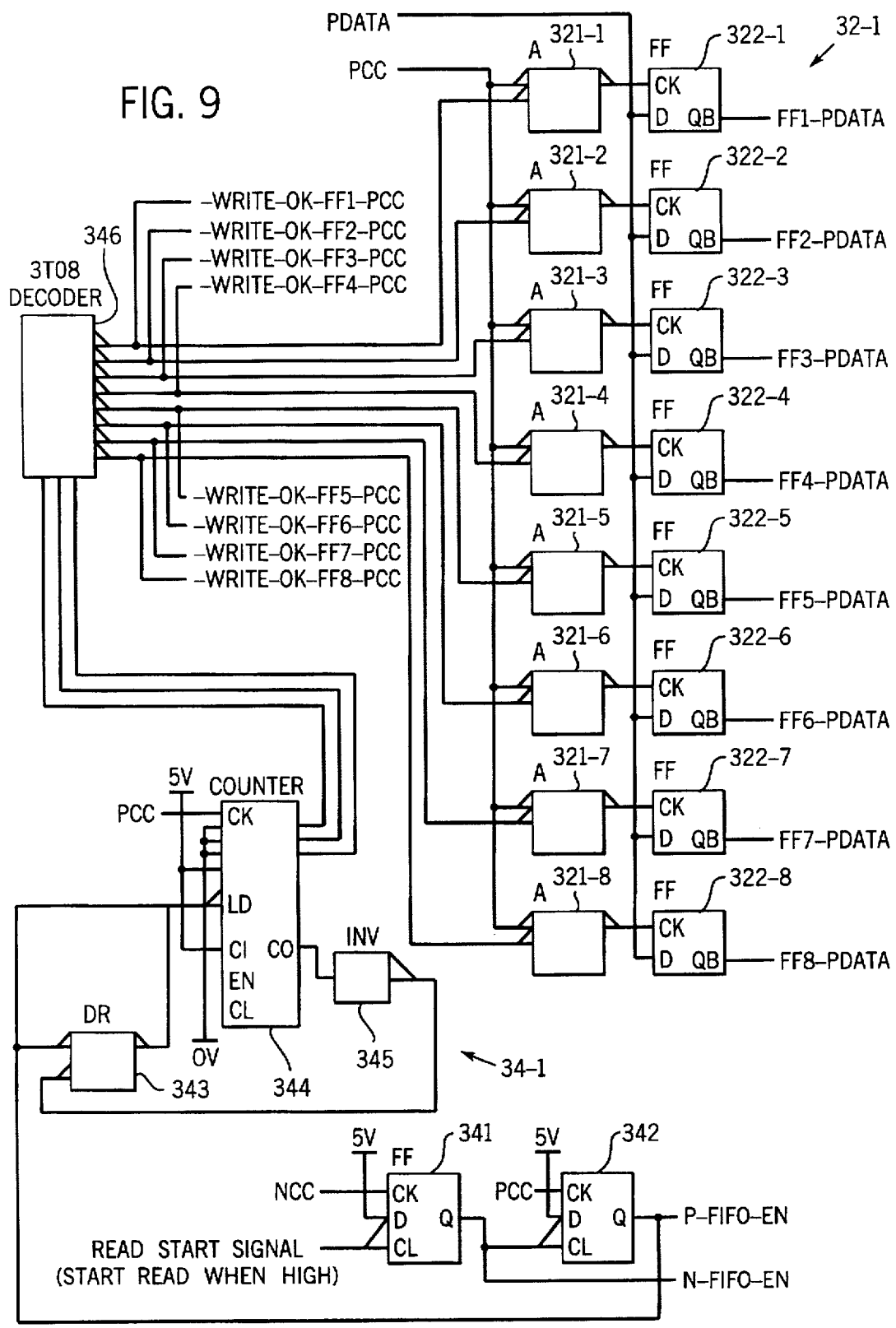
FIG. 9 is a system block diagram showing an embodiment of a PDATA write control counter and a PDATA correcting FIFO.

FIG. 9 shows an embodiment of the PDATA write control counter 34-1 and the PDATA correction FIFO 32-1. In FIG. 9, the PDATA write control counter 34-1 includes D-type flip-flops 341 and 342, an OR circuit 343, a counter 344, an inverter 345, and a decoder 346 which are connected as shown. On the other hand, a part of the PDATA correction FIFO 32-1 includes AND circuits 321-1 through 321-8, and D-type flip-flops 322-1 through 322-8 which are connected as shown.

The flip-flop 341 has a clock input terminal CK supplied with the lock NCC, a data input terminal D supplied with a fixed power supply voltage of 5 V, a clear terminal CL supplied with a read start signal which indicates the start of the read by a high level thereof. The flip-flop 342 has a clock input terminal CK supplied with the clock PCC, a data input terminal D supplied with the fixed power supply voltage of 5 V, and a clear terminal CL supplied with a Q-output of the flip-flop 341. The Q-output of the flip-flop 341 is supplied to the circuits shown in FIGS. 10 and 20 which will be described later as an enable signal P-FIFO-EN. In addition, a Q-output of the flip-flop 342 is supplied to the circuits shown in FIGS. 14 and 15 which will be described later as an enable signal N-FIFO-EN, the OR circuit 343 and an enable terminal EN of the counter 344.

The OR circuit 343 receives a carry output CO of the counter 344 via the inverter 345, and supplies an output to a load terminal LD of the counter 344. The clock PCC is supplied to a clock input terminal CK of the counter 344. Load value input terminals including a carry input terminal C1 of the counter 344 are connected to the 5 V power supply or ground. A 3-bit output of the counter 344 is converted into 8 bits by the decoder 346, and output bits -WRITE-OK-FF1-PCC through -WRITE-OK-FF8-PCC of the decoder 346 are supplied to the circuit shown in FIG. 24 and the corresponding AND circuits 321-1 through 321-8. The AND circuits 321-1 through 321-8 respectively add the clock PCC and the corresponding output bits -WRITE-OK-FF1-PCC through -WRITE-OK-FF8-PCC of the decoder 346, and supply added results to clock input terminals of the corresponding flip-flops 322-1 through 322-8. The data portion PDATA is supplied to data input terminals D of the flip-flops 322-1 through 322-8, and QB-output bits -FF1-PDATA through -FF8-PDATA of the flip-flops 322-1 through 322-8 are supplied to the circuit shown in FIG. 10.

Figure 10:
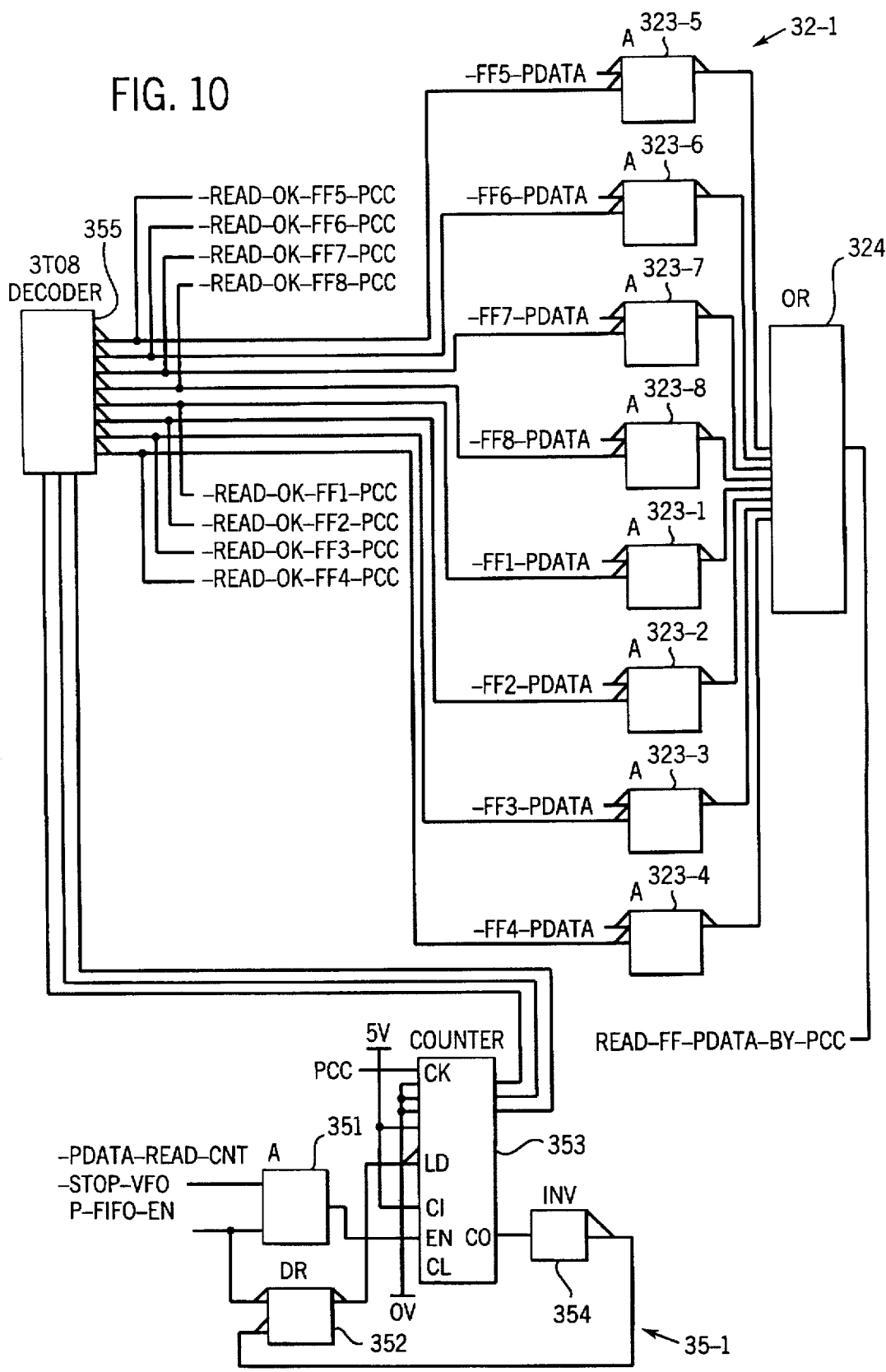
FIG. 10 is a system block diagram showing an embodiment of a PDATA read control counter and a PDATA correcting FIFO.

FIG. 10 shows an embodiment of the PDATA read control counter 35-1 and the PDATA correction FIFO 32-1. In FIG. 10, the PDATA read control counter 35-1 includes an AND circuit 351, an OR circuit 352, a counter 353, an inverter 354, and a decoder 355 which are connected as shown. On the other hand, a part of the PDATA correction FIFO 32-1 includes AND circuits 323-1 through 323-8, and an OR circuit 324 which are connected as shown.

The AND circuit 351 receives the enable signal P-FIFO-EN from the circuit shown in FIG. 9 and a stop signal -PDATA-READ-CNT-STOP-VFO from the circuit shown in FIG. 19 which will be described later. An output of this AND circuit 351 is supplied to an enable terminal EN of the counter 353. The OR circuit 352 receives the enable signal P-FIFO-EN and a carry output CO of the counter 353, and an output of the OR circuit 352 is supplied to a load terminal LD of the counter 353. The clock PCC is supplied to a clock input terminal CK of the counter 353. Load value input terminals including a carry input terminal C1 of the counter 353 are connected to the 5 V power supply or the ground. A 3-bit output of the counter 353 is converted into 8 bits by the decoder 355, and output bits -READ-OK-FF1-PCC through -READ-OK-FF8-PCC of the decoder 355 are supplied to the corresponding AND circuits 323-1 through 323-8. The AND circuits 323-1 through 323-8 respectively add the corresponding output bits -READ-OK-FF1-PCC through -READ-OK-FF8-PCC of the decoder 346 and the QB-output bits -FF1-PDATA through -FF8-PDATA of the corresponding flip-flops 322-1 through 322-8 within the circuit shown in FIG. 9, and supply added results to the OR circuit 324. An output READ-FF-PDATA-BY-PCC of the OR circuit 324 is supplied to the circuit shown in FIG. 11 which will be described later.

Figure 11:
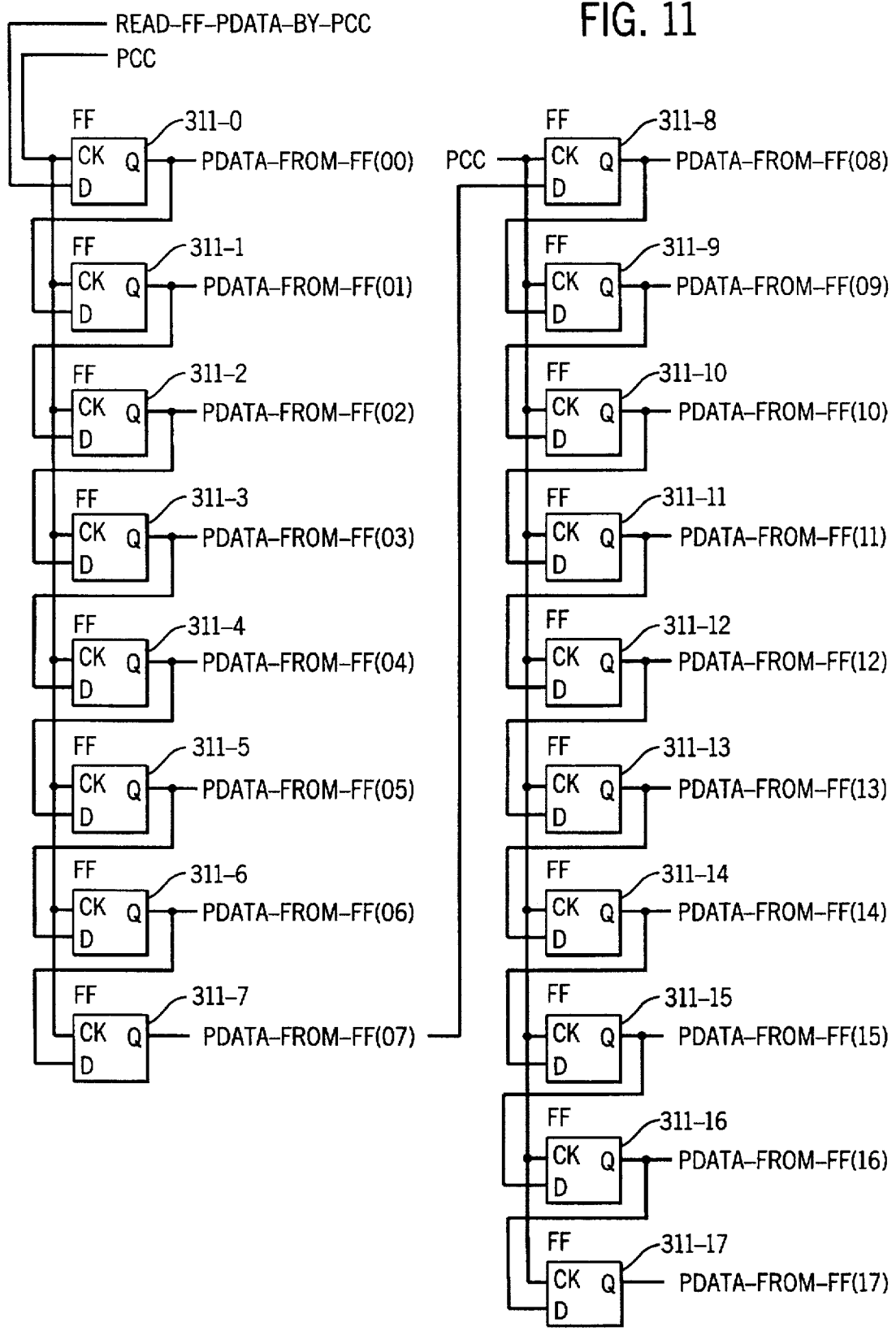
FIG. 11 is a system block diagram showing an embodiment of a PDATA shift register.

FIG. 11 shows an embodiment of the PDATA shift register 31-1. In FIG. 11, the PDATA shift register 31-1 includes D-type flip-flops 311-0 through 311-17 which are connected as shown. The clock PCC is input to input terminals CK of the flip-flops 311-0 through 311-17. The output READ-FF-PDATA-BY-PCC of the OR circuit 324 of the PDATA correction FIFO 32-1 shown in FIG. 10 is input to a data input terminal D of the flip-flop 311-0 in the first stage. Q-outputs of the flip-flops 311-0 through 311-16 are respectively input to data input terminals D of the flip-flops in the immediately subsequent stages. The Q-outputs PDATA-FROM-FF(00) through PDATA-FROM-FF(17) of the flip-flops 311-0 through 311-17 are supplied to the circuits shown in FIGS. 12 and 13 which will be described later.

Figure 12:
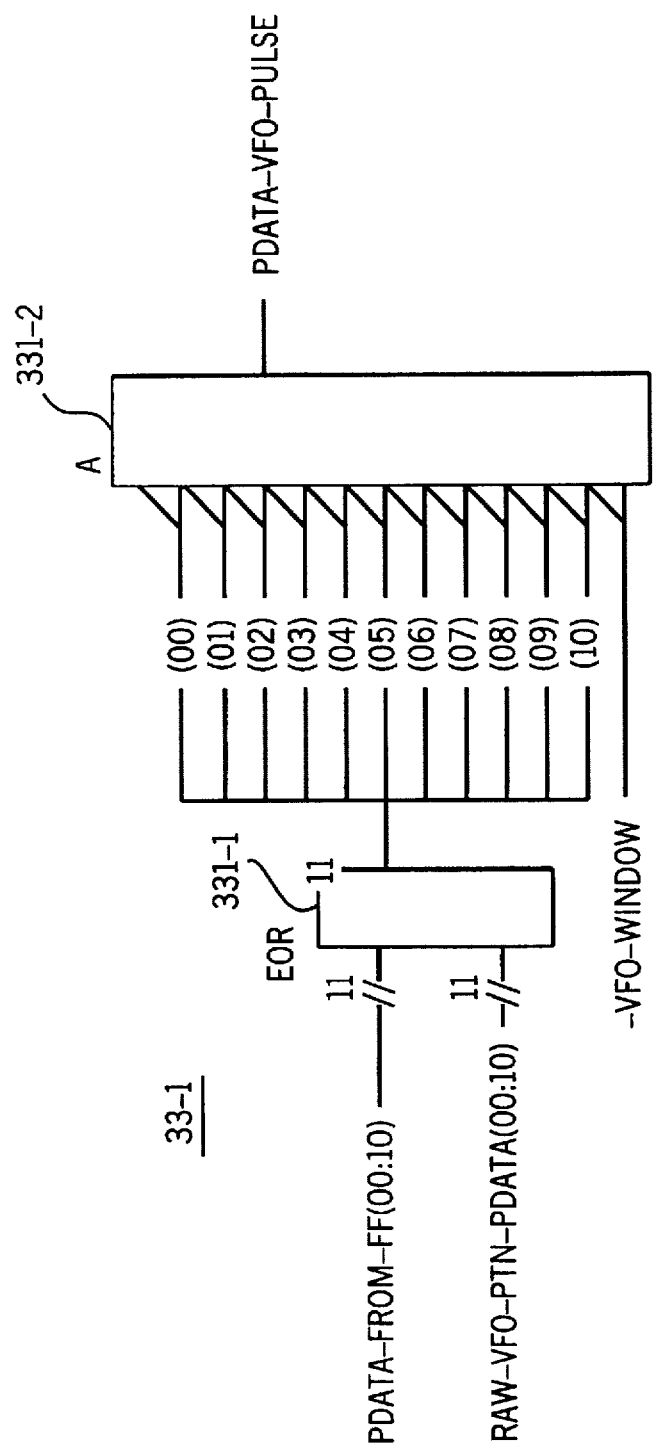
FIG. 12 is a system block diagram showing an embodiment of a detector which detects a VFO of PDATA.

FIG. 12 shows an embodiment of the VFO detector 33-1 which detects the VFO of the data portion PDATA. In FIG. 12, the VFO detector 33-1 includes an exclusive-OR (EOR) circuit 331-1 and an AND circuit 331-2. The output PDATA-FROM-FF(00) through PDATA-FROM-FF(10) of the flip-flops 311-0 through 311-10 shown in FIG. 11 and a VFO comparison bit pattern RAW-VFO-PTN-PDATA(00-10) of the data portion PDATA are input to the exclusive-OR circuit 331-1. The VFO comparison bit pattern RAW-VFO-PTN-PDATA(00-10) is "10001000100". An output of the exclusive-OR circuit 331-1 is supplied to the AND circuit 331-2 together with a window output VFO-WINDOW which is used to detect the VFO and is received from the circuit shown in FIG. 19 which will be described later. An output PDATA-VFO-PULSE of the AND circuit 331-2 is supplied to the circuit shown in FIG. 19.

Figure 13:
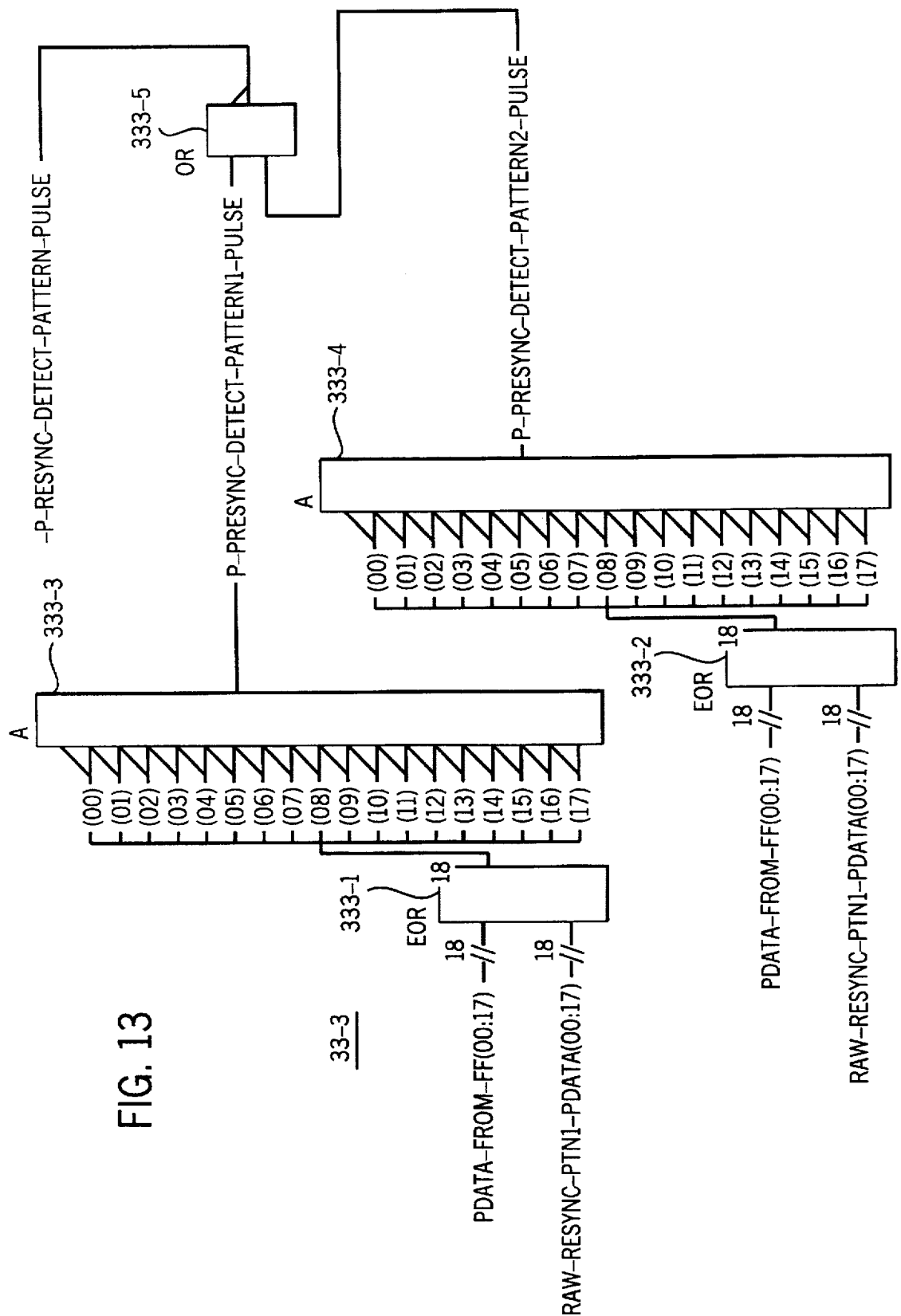
FIG. 13 is a system block diagram showing an embodiment of a detector which detects a RS of PDATA.

FIG. 13 shows an embodiment of the RS detector 33-3 which detects the RS of the data portion PDATA. In FIG. 13, the RS detector 33-3 includes exclusive-OR circuits 333-1 and 333-2, AND circuits 333-3 and 333-4, and an OR circuit 333-5. The outputs PDATA-FROM-FF(00) through PDATA-FROM-FF(17) of the flip-flops 311-0 through 311-17 shown in FIG. 11 and one RS comparison bit pattern RAW-RESYNC-PTN1-PDATA(00-17) of the data portion PDATA are input to the exclusive-OR circuit 333-1. The RS comparison bit pattern RAW-RESYNC-PTN1-PDATA(00-17) is "010000000000000010". An output of the exclusive-OR circuit 333-1 is input to the AND circuit 333-3. On the other hand, the outputs PDATA-FROM-FF(00) through PDATA-FROM-FF(17) of the flip-flops 311-0 through 311-17 shown in FIG. 11 and the other RS comparison bit pattern RAW-RESYNC-PTN2-PDATA(00-17) are input to the exclusive-OR circuit 333-2. This other RS comparison bit pattern RAW-RESYNC-PTN2-PDATA(00-17) is "000000001000000000". An output of the exclusive-OR circuit 333-2 is input to the AND circuit 333-4. An output P-RESYNC-DETECT-PATTERN1-PULSE of the AND circuit 333-3 and an output P-RESYNC-DETECT-PATTERN2-PULSE of the AND circuit 333-4 are input to the OR circuit 333-5. An output -P-RESYNC-DETECT-PATTERN-PULSE of the OR circuit 333-5 is supplied to the circuit shown in FIG. 20 which will be described later.

Figure 14:
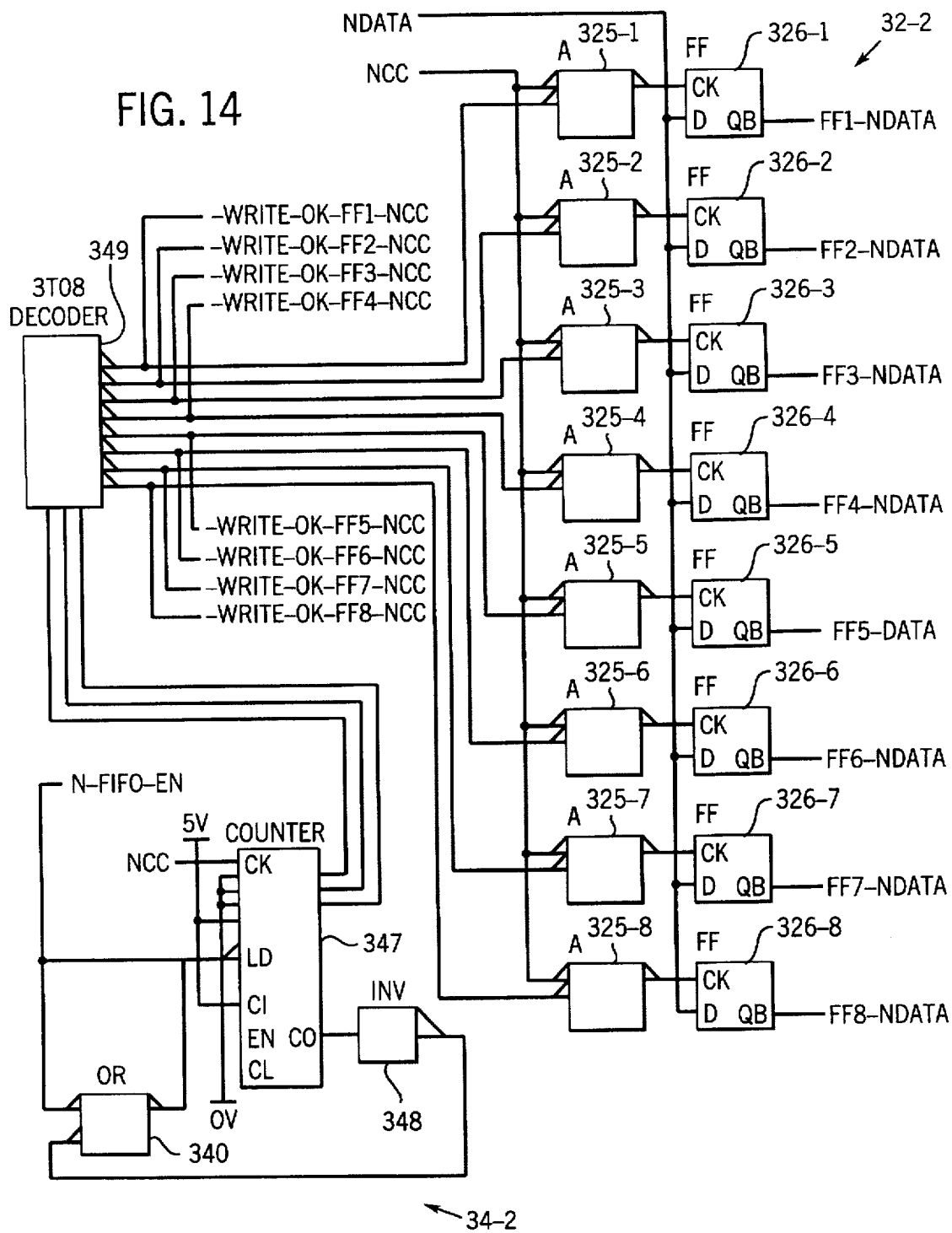
FIG. 14 is a system block diagram showing an embodiment of a NDATA write control counter and a NDATA correcting FIFO.

FIG. 14 shows an embodiment of the NDATA write control counter 34-2 and the NDATA correction FIFO 32-2. In FIG. 14, The NDATA write control counter 34-2 includes an OR circuit 340, a counter 347, an inverter 348, and a decoder 349 which are connected as shown. On the other hand, a part of the NDATA correction FIFO 32-2 includes AND circuits 325-1 through 325-8, and D-type flip-flops 326-1 through 326-8 which are connected as shown.

The OR circuit 340 receives the enable signal N-FIFO-EN from the flip-flop 341 shown in FIG. 9 and a carry output CO of the counter 347 via the inverter 348, and supplies an output to a load terminal LD of the counter 347. The clock NCC is supplied to a clock input terminal CK of the counter 347. Load value input terminals including a carry input terminal C1 of the counter 347 are connected to the 5 V power supply or ground. A 3-bit output of the counter 347 is converted into 8 bits by the decoder 349, and output bits -WRITE-OK-FF1-NCC through -WRITE-OK-FF8-NCC of the decoder 349 are supplied to the circuit shown in FIG. 25 and the corresponding AND circuits 325-1 through 325-8. The AND circuits 325-1 through 325-8 respectively add the clock NCC and the corresponding output bits -WRITE-OK-FF1-NCC through -WRITE-OK-FF8-NCC of the decoder 349, and supply added results to clock input terminals of the corresponding flip-flops 326-1 through 326-8. The data portion NDATA is supplied to data input terminals D of the flip-flops 326-1 through 326-8, and QB-output bits -FF1-NDATA through -FF8-NDATA of the flip-flops 326-1 through 326-8 are supplied to the circuit shown in FIG. 15.

Figure 15:
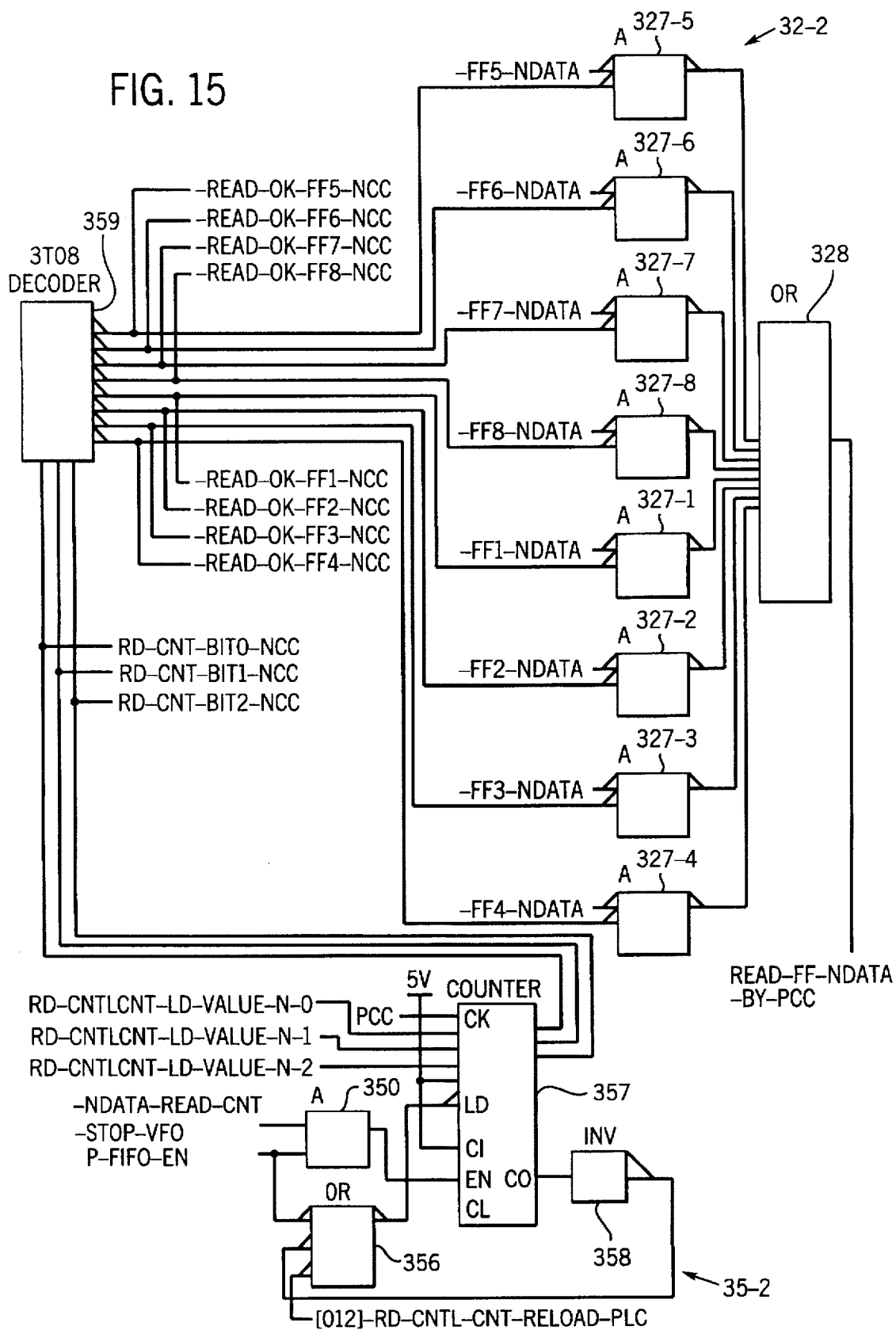
FIG. 15 is a system block diagram showing an embodiment of a NDATA read control counter and a NDATA correcting FIFO.

FIG. 15 shows an embodiment of the NDATA read control counter 35-2 and the NDATA correction FIFO 32-2. In FIG. 15, the NDATA read control counter 35-2 includes an AND circuit 350, an OR circuit 356, a counter 357, an inverter 358, and a decoder 359 which are connected as shown. On the other hand, a part of the NDATA correction FIFO 32-2 includes AND circuits 327-1 through 327-8, and an OR circuit 328 which are connected as shown.

The AND circuit 350 receives the enable signal N-FIFO-EN from the circuit shown in FIG. 9 and a stop signal -NDATA-READ-CNT-STOP-VFO from the circuit shown in FIG. 19 which will be described later. An output of this AND circuit 350 is supplied to an enable terminal EN of the counter 357. The OR circuit 356 receives the enable signal N-FIFO-EN, an output -RD-CNTL-CNT-RELOAD-PLS from the circuit shown in FIG. 20 which will be described later, and a carry output CO of the counter 357 via the inverter 358. An output of the OR circuit 356 is supplied to a load terminal LD of the counter 357. The clock PCC is supplied to a clock input terminal CK of the counter 357. Two load value input terminals including a carry input terminal C1 of the counter 357 are connected to the 5 V power supply, while the other load input terminals receive outputs RD-CNTLCNT-LD-VALUE-N-0 through RD-CNTLCNT-LD-VALUE-N-3 from the circuit shown in FIG. 23 which will be described later. 3 bits RD-CNT-BIT0-NCC through RD-CNT-BIT3-NCC output from the counter 357 are converted into 8 bits by the decoder 359, and output bits -READ-OK-FF1-NCC through -READ-OK-FF8-NCC of the decoder 359 are supplied to the corresponding AND circuits 327-1 through 327-8. The 3 bits RD-CNT-BIT0-NCC through RD-CNT-BIT3-NCC output from the counter 357 are also supplied to the circuit shown in FIG. 23 which will be described later. The AND circuits 327-1 through 327-8 respectively add the corresponding output bits -READ-OK-FF1-NCC through -READ-OK-FF8-NCC of the decoder 349 and the QB-output bits -FF1-NDATA through -FF8-NDATA of the corresponding flip-flops 326-1 through 326-8 within the circuit shown in FIG. 14, and supply added results to the OR circuit 328. An output READ-FF-NDATA-BY-PCC of the OR circuit 328 is supplied to the circuit shown in FIG. 16 which will be described later.

FIG. 16 shows an embodiment of the NDATA shift register 31-2. In FIG. 16, the NDATA shift register 31-2 includes D-type flip-flops 312-0 through 312-17 which are connected as shown. The clock PCC is input to input terminals CK of the flip-flops 312-0 through 312-17. The output READ-FF-NDATA-BY-PCC of the OR circuit 328 of the NDATA correction FIFO 32-2 shown in FIG. 15 is input to a data input terminal D of the flip-flop 312-0 in the first stage. Q-outputs of the flip-flops 312-0 through 312-16 are respectively input to data input terminals D of the flip-flops in the immediately subsequent stages. The Q-outputs NDATA-FROM-FF(00) through NDATA-FROM-FF(17) of the flip-flops 312-0 through 312-17 are supplied to the circuits shown in FIGS. 17 and 18 which will be described later.

Figure 17:
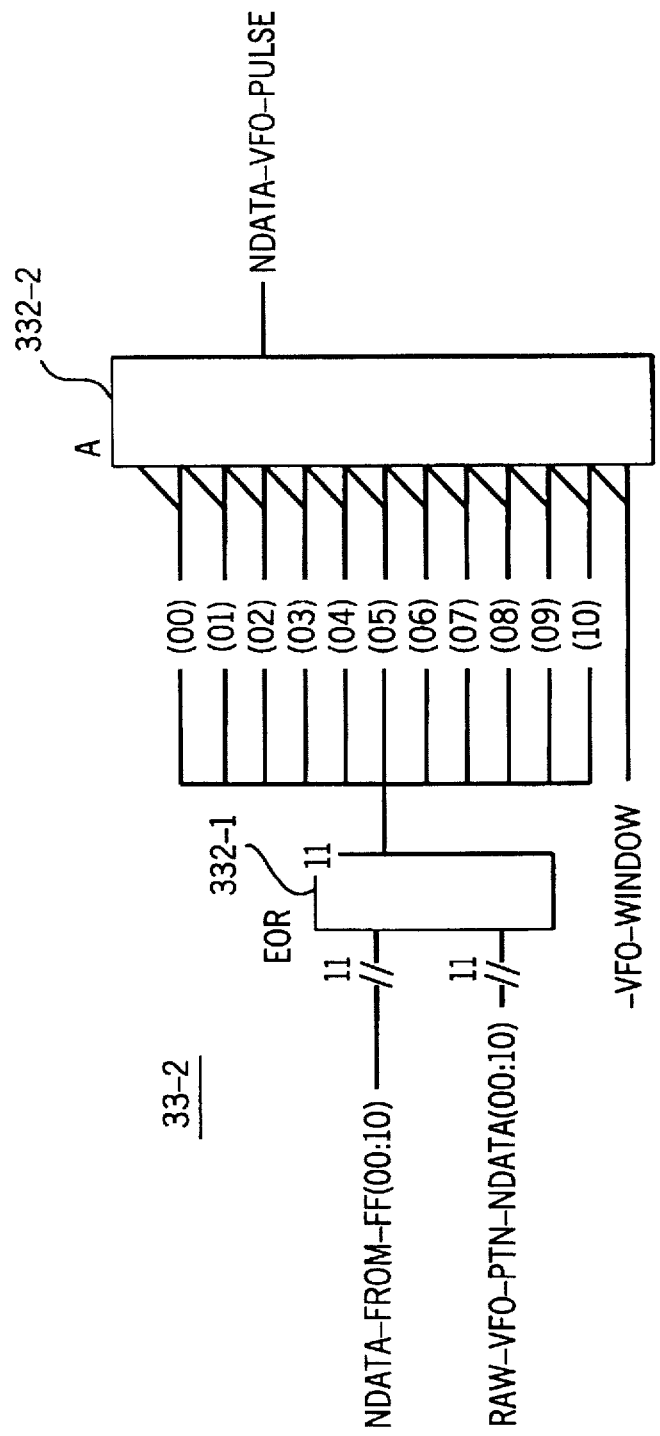
FIG. 17 is a system block diagram showing an embodiment of a detector which detects a VFO of NDATA.

FIG. 17 shows an embodiment of the VFO detector 33-2 which detects the VFO of the data portion NDATA. In FIG. 17, the VFO detector 33-2 includes an exclusive-OR (EOR) circuit 332-1 and an AND circuit 332-2. The output NDATA-FROM-FF(00) through NDATA-FROM-FF(10) of the flip-flops 312-0 through 312-10 shown in FIG. 16 and a VFO comparison bit pattern RAW-VFO-PTN-NDATA(00-10) of the data portion NDATA are input to the exclusive-OR circuit 332-1. The VFO comparison bit pattern RAW-VFO-PTN-NDATA(00-10) is "00100010001". An output of the exclusive-OR circuit 332-1 is supplied to the AND circuit 332-2 together with the a window output VFO-WINDOW which is used to detect the VFO and is received from the circuit shown in FIG. 19 which will be described later. An output NDATA-VFO-PULSE of the AND circuit 332-2 is supplied to the circuit shown in FIG. 19.

Figure 18:
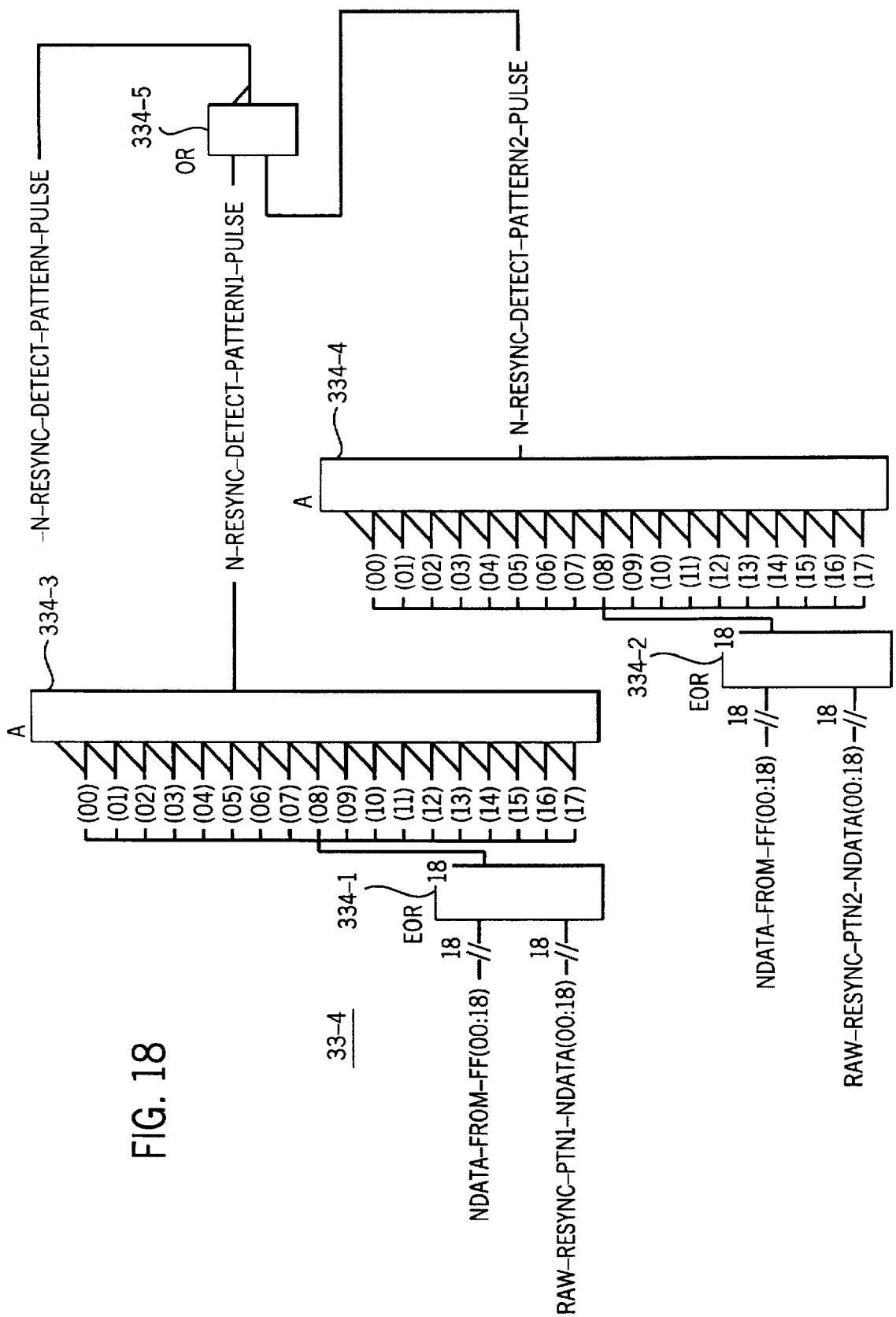
FIG. 18 is a system block diagram showing an embodiment of a detector which detects a RS of NDATA.

FIG. 18 shows an embodiment of the RS detector 33-4 which detects the RS of the data portion NDATA. In FIG. 18, the RS detector 33-4 includes exclusive-OR circuits 334-1 and 334-2, AND circuits 334-3 and 334-4, and an OR circuit 334-5. The outputs NDATA-FROM-FF(00) through NDATA-FROM-FF(17) of the flip-flops 312-0 through 312-17 shown in FIG. 16 and one RS comparison bit pattern RAW-RESYNC-PTN1-NDATA(00-17) of the data portion NDATA are input to the exclusive-OR circuit 334-1. The RS comparison bit pattern RAW-RESYNC-PTN1-NDATA(00-17) is "000000001000000000". An output of the exclusive-OR circuit 334-1 is input to the AND circuit 334-3. On the other hand, the outputs NDATA-FROM-FF(00) through NDATA-FROM-FF(17) of the flip-flops 312-0 through 312-17 shown in FIG. 16 and the other RS comparison bit pattern RAW-RESYNC-PTN2-NDATA(00-17) are input to the exclusive-OR circuit 334-2. This other RS comparison bit pattern RAW-RESYNC-PTN2-NDATA(00-17) is "010000000000000010". An output of the exclusive-OR circuit 334-2 is input to the AND circuit 334-4. An output N-RESYNC-DETECT-PATTERN1-PULSE of the AND circuit 334-3 and an output N-RESYNC-DETECT-PATTERN2-PULSE of the AND circuit 334-4 are input to the OR circuit 334-5. An output -N-RESYNC-DETECT-PATTERN-PULSE of the OR circuit 334-5 is supplied to the circuit shown in FIG. 20 which will be described later.

FIG. 19 shows an embodiment of the stop signal generation circuit 33-5. In FIG. 19, the stop signal generation circuit 33-5 includes D-type flip-flops 335-1, 335-2,335-7 and 335-8, AND circuits 335-3 through 335-5 and 335-10, an OR circuit 335-6, and a JK flip-flop 335-9 which are connected as shown.

The clock PCC is input to clock input terminal CK of the flip-flops 335-1 and 335-2. The output NDATA-VFO-PULSE from the circuit shown in FIG. 17 is input to a data input terminal D of the flip-flop 335-1 and the AND circuits 335-3 and 335-5. The output PDATA-VFO-PULSE from the circuit shown in FIG. 12 is input to a data input terminal D of the flip-flop 335-2 and the AND circuits 335-3 and 335-4. A Q-output of the flip-flop 335-1 is input to the AND circuit 335-4, and a Q-output of the flip-flop 335-2 is input to the AND circuit 335-5. Accordingly, the AND circuit 335-3 outputs a pulse which asserts when the outputs NDATA-VFO-PULSE and PDATA-VFO-PULSE are generated simultaneously. The AND circuit 335-4 outputs a pulse which asserts when the output NDATA-VFO-PULSE is generated 1 clock before the output PDATA-VFO-PULSE. In addition, the AND circuit 335-5 outputs a pulse which asserts when the output PDATA-VFO-PULSE is generated 1 clock before the output NDATA-VFO-PULSE.

The output of the AND circuit 335-3 is input to the OR circuit 335-6. The output of the AND circuit 335-4 is input to the OR circuit 335-6 and a data input terminal D of the flip-flop 335-7. The output of the AND circuit 335-5 is input to the OR circuit 335-6 and a data input terminal D of the flip-flop 335-8. Hence, a stop signal -NDATA-READ-CNT-STOP-VFO which stops the NDATA read control counter 35-2 is output from the flip-flop 335-7 and is supplied to the circuit shown in FIG. 15. On the other hand, a stop signal -PDATA-READ-CNT-STOP-VFO which stops the PDATA read control counter 35-1 is output from the flip-flop 335-8 and is supplied to the circuit shown in FIG. 10.

An output of the OR circuit 335-6 negates the VFO window in response to the VFO-PULSE detection. This output of the OR circuit 335-6 is input to an input terminal J of the flip-flop 335-9. The clock PCC is input to a clock input terminal CK of the flip-flop 335-9, and an input terminal K of the flip-flop 335-9 is grounded. A window generating instruction signal from the MPU 4 shown in FIG. 6, for example, is input to a clear terminal CL of the flip-flop 335-9 and the AND circuit 335-10. A Q-output of the flip-flop 335-9 is also input to the AND circuit 335-10. As a result, the window output -VFO-WINDOW which indicates the window for the VFO detection is output from the AND circuit 335-10 and is supplied to the PDATA and NDATA read control counters 25-1 and 35-2.

FIG. 20 shows an embodiment of the timing generation circuit 33-6. In FIG. 20, the timing generation circuit 33-6 includes AND circuits 336-1 through 336-3, 336-8 and 336-11, JK flip-flops 336-4 through 336-4, D-type flip-flops 336-9 and 336-10, and an inverter 336-12 which are connected as shown.

The window signal -P-RESYNC-WINDOW and the output -P-RESYNC-DETECT-PATTERN-PULSE from the circuit shown in FIG. 13 are input to the AND circuit 335-1. The output -P-RESYNC-DETECT-PATTERN-PULSE corresponds to the resync pulse RS which is detected from the data portion PDATA, and the window signal -P-RESYNC-WINDOW indicates the window for detecting the RS of the data portion PDATA. On the other hand, the window signal -N-RESYNC-WINDOW and the output -N-RESYNC-DETECT-PATTERN-PULSE from the circuit shown in FIG. 18 are input to the AND circuit 335-2. The output -N-RESYNC-DETECT-PATTERN-PULSE corresponds to the resync pulse RS which is detected from the data portion NDATA, and the window signal -N-RESYNC-WINDOW indicates the window for detecting the RS of the data portion NDATA. An output P-RESYNC-DETECT-OK of the AND circuit 336-1 and an output N-RESYNC-DETECT-OK of the AND circuit 336-2 are input to the AND circuit 336-3 and the circuit shown in FIG. 22 which will be described later. The output P-RESYNC-DETECT-OK of the AND circuit 336-1 is also input to an input terminal J of the flip-flop 336-4, and the output N-RESYNC-DETECT-OK of the AND circuit 336-2 is also input to an input terminal J of the flip-flop 336-6. An output of the AND circuit 336-3 is input to an input terminal J of the flip-flop 336-5.

The clock PCC is input to clock input terminals CK of the flip-flops 336-4 through 336-6. Input terminals K of the flip-flops 336-4 through 336-6 are grounded, and an output of the OR circuit 336-7 is input to clear terminals CL of the flip-flops 336-4 through 336-6. A signal RESYNC-FOUND-CLRPLS and the enable signal P-FIFO-EN from the circuit shown in FIG. 9 are input to the OR circuit 336-7. Accordingly, a clear pulse which clears the latch of the RS is output from the OR circuit 336-7.

A Q-output of the flip-flop 336-4 is supplied to the circuit shown in FIG. 21 which will be described later as a RS detection latch signal P-RESYNC-FOUND, and a QB-output of the flip-flop 336-4 is supplied to the circuit shown in FIG. 21 as a signal -P-RESYNC-FOUND. A QB-output of the flip-flop 336-5 is supplied to the circuits shown in FIGS. 21 and 22 which will be described later as a signal -JUST-RESYNC-OK which assets only when the RS of the data portion PDATA and the RS of the data portion NDATA are generated simultaneously. A Q-output of the flip-flop 336-6 is supplied to the circuit shown in FIG. 21 which will be described later as a RS detection latch signal N-RESYNC-FOUND, and a QB-output of the flip-flop 336-6 is supplied to the circuit shown in FIG. 21 as a signal -N-RESYNC-FOUND.

The outputs P-RESYNC-FOUND and N-RESYNC-FOUND of the flip-flops 336-4 and 336-6 are input to the AND circuit 336-8, and the AND circuit 336-8 outputs a signal which asserts when the RS of the data portion PDATA and the RD of the data portion NDATA are both detected. This output signal of the AND circuit 336-8 is input to a data input terminal D of the flip-flop 336-9. A Q-output of the flip-flop 336-9 is input to a data input terminal D of the flip-flop 336-10 and the AND circuit 336-11. The clock PCC is input to clock input terminals CK of the flip-flops 336-9 and 336-10. A QB-output of the flip-flop 336-10 is input to the AND circuit 336-11. Accordingly, a signal RD-CNTL-CNT-RELOAD-LOAD-VALUE-EN which asserts the load value when reloading with respect to the NDATA read control counter 35-2 is output from the AND circuit 336-11 and is supplied to the circuit shown in FIG. 23 which will be described later. On the other hand, the output signal RD-CNTL-CNT-RELOAD-LOAD-VALUE-EN of the AND circuit 336-11 is inverted in the inverter 336-12. As a result, a pulse signal -RD-CNTL-CNT-RELOAD-PLS which reloads with respect to the NDATA read control counter 35-2 is output from the inverter 336-12 and is supplied to the circuit shown in FIG. 15.

FIG. 21 shows an embodiment of the calculation circuit 33-7. In FIG. 21, the calculation circuit 33-7 includes a D-type flip-flop 337-1, counters 337-2 and 337-3, and inverters 337-4 through 337-6 which are connected as shown.

The clock PCC is input to clock input terminals CK of the flip-flop 337-1 and the counters 337-2 and 337-3. The signal N-RESYNC-FOUND from the circuit shown in FIG. 13 is input to a data input terminal D of the flip-flop 337-1, and signals -P-RESYNC-FOUND and -JUST-RESYNC-OK are respectively input to an enable terminal EN and a clear terminal CL of the counter 337-2. A Q-output of the flip-flop 337-1 is input to the counter 337-2. On the other hand, the signal P-RESYNC-FOUND from the circuit shown in FIG. 13 is input to the counter 337-3, and signals -N-RESYNC-FOUND and -JUST-RESYNC-OK are respectively input to an enable terminal EN and a clear terminal CL of the counter 337-3. Carry input terminals C1 of the counters 337-2 and 337-3 are connected to the 5 V power supply, and other load value input terminals of the counters 337-2 and 337-3 are grounded.

Therefore, the counter 337-2 measures the error quantity when the RS of the data portion NDATA is detected before the RS of the data portion PDATA, while the counter 337-3 measures the error quantity when the RD of the data portion NDATA is detected after the RS of the data portion PDATA. An output of the counter 337-2 is input to the inverters 337-4 through 337-6, and outputs -N-RESYNC-FAST-CNT(0) through -N-RESYNC-FAST-CNT(2) of the inverters 337-4 through 337-6 are supplied to the circuit shown in FIG. 22 which will be described later. On the other hand, outputs -N-RESYNC-LATE-CNT(0) through -N-RESYNC-LATE-CNT(0) of the counter 337-3 are supplied to the circuit shown in FIG. 22.

FIG. 22 shows an embodiment of the selection circuit 33-8. In FIG. 22, the selection circuit 33-8 includes OR circuits 338-1, 338-2 and 338-11 through 338-13, JK flip-flops 338-3 through 338-4, and AND circuits 338-5 through 338-10 which are connected as shown.

The signal -JUST-RESYNC-OK from the circuit shown in FIG. 20, the signal -RESYNC-FOUND-CLRPLS, and a QB-output of the flip-flop 338-4 are input to the OR circuit 338-1, and an output of this OR circuit 338-1 is input to a clear terminal CL of the flip-flop 338-3. On the other hand, the signal -JUST-RESYNC-OK from the circuit shown in FIG. 20, the signal -RESYNC-FOUND-CLRPLS, and a QB-output of the flip-flop 338-3 are input to the OR circuit 338-2, and an output of this OR circuit 338-2 is input to a clear terminal CL of the flip-flop 338-4. The clock PCC is input to a clock input terminal CK of the flip-flop 338-3. The signal N-RESYNC-DETECT-OK from the circuit shown in FIG. 20 is input to an input terminal J of the flip-flop 338-3, and an input terminal K of this flip-flop 338-3 is grounded. The clock PCC is input to a clock input terminal CK of the flip-flop 338-4. The signal P-RESYNC-DETECT-OK from the circuit shown in FIG. 20 is input to an input terminal J of the flip-flop 338-4, and an input terminal K of this flip-flop 338-4 is grounded.

A Q-output of the flip-flop 338-3 is input to the AND circuits 338-5, 338-7 and 338-9, and a Q-output of the flip-flop 338-4 is input to the AND circuit 338-6, 338-8 and 338-10. The signals -NRESYNC-FAST-CNT(0), -NRESYNC-LATE-CNT(0), -NRESYNC-FAST-CNT(2), -NRESYNC-LATE-CNT(2), -NRESYNC-FAST-CNT(0) and -NRESYNC-LATE-CNT(0) from the circuit shown in FIG. 21 are respectively input to the AND circuits 338-5 through 338-10. Outputs of the AND circuits 338-5 and 338-6 are input to the OR circuit 338-11, outputs of the AND circuits 338-7 and 338-8 are input to the OR circuit 338-12, and outputs of the AND circuits 338-9 and 338-10 are input to the OR circuit 338-13. Hence, signals SELECT-VALUE-TO-ADD(0) through SELECT-VALUE-TO-ADD(2) which indicates the error quantity when the RS of the data portion NDATA is detected earlier or later than the RS of the data portion PDATA are output from the OR circuits 338-11 through 338-13 and supplied to the circuit shown in FIG. 23 which will be described later.

FIG. 23 shows an embodiment of the load value changing circuit 33-9. In FIG. 23, the load value changing circuit 33-9 includes an adder 339-1, and AND circuits 339-2 through 339-4 which are connected as shown.

The signals RD-CNT-BIT0-NCC through RD-CNT-BIT2-NCC from the circuit shown in FIG. 15 and the signals SELECT-VALUE-TO-ADD(O) through SELECT-VALUE-TO-ADD(2) from the circuit shown in FIG. 22 are input to the adder 339-1. Output bits of the adder 339-1 are input to the corresponding AND circuits 339-2 through 339-4. The signal RD-CNTL-CNT-RELOAD-LOAD-VALUE-EN from the circuit shown in FIG. 20 is also input to the AND circuits 339-2 through 339-4. Signals RD-CNTLCNT-LD-VALUE-N-2 through RD-CNTLCNT-LD-VALUE-N-0 are respectively output from the AND circuits 339-2 through 339-4 and supplied to the circuit shown in FIG. 15.

Accordingly, the present counted value of the NDATA read control counter 35-2 is added to the error quantity between the detection of the RS in the data portion NDATA and the detection of the RS in the data portion PDATA, and the added result is used as the load value of the NDATA read control counter 35-2. If the RS of the data portion NDATA is detected earlier than the RS of the data portion PDATA, the present counted value of the NDATA read control counter 35-2 is added to an inverted value of the error quantity. As a result, the data RD-CNTLCNT-LD-VALUE-N-0 through RD-CNTLCNT-LD-VALUE-N-2 which are generated to correct the error quantity are loaded to the NDATA read control counter 35-2 as the load value.

FIG. 24 shows an embodiment of the PDATA synthesizing part 40-1. In FIG. 24, the PDATA synthesizing part 40-1 includes D-type flip-flops 401-1 through 401-14, AND circuits 402-1 through 402-8, D-type flip-flops 403-1 through 403-8, AND circuits 404-1 through 404-8, and an OR circuit 405 which are connected as shown.

The clock PCC is input to clock input terminals CK of the flip-flops 401-1 through 401-14. The data portion PDATA input to a data input terminal D of the flip-flop 401-1 provided in the first stage are successively shifted in the flip-flops 401-1 through 401-14. A Q-output of the flip-flop 401-14 provided in the last stage is input to data input terminals D of the flip-flops 403-1 through 403-8.

The clock PCC and the corresponding signals -WRITE-OK-FF1-PCC through -WRITE-OK-FF8-PCC from the circuit shown in FIG. 9 are input to the AND circuits 402-1 through 402-8. Outputs of the AND circuits 402-1 through 402-8 are input to clock input terminals CK of the corresponding flip-flops 403-1 through 403-8.

QB-outputs of the flip-flops 403-1 through 403-8 are input to the AND circuits 404-1 through 404-8 as signals -FF1-PDATA-TRUE through -FF8-PDATA-TRUE. In addition, the corresponding signals -READ-OK- FF1-PCC through -READ-OK-FF8-PCC from the circuit shown in FIG. 10 are also input to the AND circuits 404-1 through 404-8. Outputs of the AND circuits 404-1 through 404-8 are input to the OR circuit 405, and an output READ-PDATA-TRUE-FIFO of the OR circuit 405 is supplied to the circuit shown in FIG. 26 which will be described later.

Therefore, the PDATA read control counter 35-1 is correctly corrected by the detection of the VFO and the RS pattern. For this reason, it is possible to correctly read the VFO and the RS pattern from the PDATA synthesizing FIFO of the PDATA synthesizing part 40-1 by delaying the data entered within the PDATA synthesizing FIFO.

FIG. 25 shows an embodiment of the NDATA synthesizing part 40-2. In FIG. 25, the NDATA synthesizing part 40-2 includes D-type flip-flops 411-1 through 411-14, AND circuits 412-1 through 412-8, D-type flip-flops 413-1 through 413-8, AND circuits 414-1 through 414-8, and an OR circuit 415 which are connected as shown.

The clock NCC is input to clock input terminals CK of the flip-flops 411-1 through 411-14. The data portion NDATA input to a data input terminal D of the flip-flop 411-1 provided in the first stage are successively shifted in the flip-flops 411-1 through 411-14. A Q-output of the flip-flop 411-14 provided in the last stage is input to data input terminals D of the flip-flops 413-1 through 413-8. The clock NCC and the corresponding signals -WRITE-OK-FF1-NCC through -WRITE-OK-FF8-NCC from the circuit shown in FIG. 14 are input to the AND circuits 412-1 through 412-8. Outputs of the AND circuits 412-1 through 412-8 are input to clock input terminals CK of the corresponding flip-flops 413-1 through 413-8.

QB-outputs of the flip-flops 413-1 through 413-8 are input to the AND circuits 414-1 through 414-8 as signals -FF1-NDATA-TRUE through -FF8-NDATA-TRUE. In addition, the corresponding signals -READ-OK-FF1-NCC through -READ-OK-FF8-NCC from the circuit shown in FIG. 15 are also input to the AND circuits 414-1 through 414-8. Outputs of the AND circuits 414-1 through 414-8 are input to the OR circuit 415, and an output READ-NDATA-TRUE-FIFO of the OR circuit 415 is supplied to the circuit shown in FIG. 26 which will be described later.

Therefore, the NDATA read control counter 35-2 is correctly corrected by the detection of the VFO and the RS pattern. For this reason, it is possible to correctly read the VFO and the RS pattern from the NDATA synthesizing FIFO of the NDATA synthesizing part 40-2 by delaying the data entered within the NDATA synthesizing FIFO.

FIG. 26 shows an embodiment of the read signal synthesizing part 40-3. In FIG. 26, the read signal synthesizing part 40-3 includes an OR circuit 421 and a flip-flop 422 which are connected as shown. The signal READ-PDATA-TRUE-FIFO from the circuit shown in FIG. 24 and the signal READ-NDATA-TRUE-FIFO from the circuit shown in FIG. 25 are input to the OR circuit 421, and an output of the OR circuit 421 is input to a data input terminal D of the flip-flop 422. Hence, a data 1/7RDDT which is the RLL(1, 7) modulation code after the synthesis is output from the flip-flop 422. This data 1/7RDDT is supplied to the decoder 43 shown in FIG. 7 and decoded.

Returning now to the description of FIG. 7, the ID read signal generation circuit 36 generates an ID read signal based on the amplitude detection signal REFNV from the read amplifier part 12A, and this ID read signal is supplied to the window generation circuit 37. The window generation circuit 37 also receives the signal AMSYNCWI which is supplied from the semiconductor chip 20 and indicates the windows with respect to the AM and SYNC. The window generation circuit 37 generates the window signals which are required to make the AM detection in the AM detection circuit 38 and the SYNC detection in the SYNC detection circuit 42. The window generation circuit 37 supplies the window signals to the AM detection circuit 38 and to the SYNC detection circuit 42 via the AM detection circuit 38. The data and clock from the shift register part 41 are supplied to the AM detection circuit 38. The AM detection circuit 38 detects the AM from the supplied data, and supplies the AM detection result to the S/P conversion circuit 46 via the SYNC detection circuit 42. On the other hand, the data and clock from the shift register part 41 are also supplied to the SYNC detection circuit 42. The SYNC detection circuit 42 detects the SYNC from the DATA, and supplies the SYNC detection result to the S/P conversion circuit 46, the decoder 43 and the RS counter 44. The clock from the SYNC detection circuit 42 is frequency-divided by the frequency divider 47, and the frequency divided clock is supplied to the decoder 43 together with the clock before the frequency division.

The RS counter 44 counts the RS based on the clock and the detection result from the SYNC detection circuit 42, and supplies a counted value to the RS detection circuit 45. The RS detection circuit 45 detects the RS and supplies the RS detection result to the S/P conversion circuit 46.

Accordingly, the decoder 43 subjects the data 1/7RDDT from the shift register 41 to the RLL(1, 7) decoding based on the clock, and decoded data are supplied to the S/P conversion circuit 46. The S/P conversion circuit 46 converts the decoded serial data into parallel data based on the detection results received from the SYNC detection circuit 42 and the RS detection circuit 45, and supplies the parallel data to the semiconductor chip 20. In other words, since two independent PLL circuits (VFO circuits 13 and 14) which oscillate at frequencies that are approximately the same exist, the phases synthesized in the FIFO parts deviate and the phase error occurs if the clock slip of the PLL circuits occurs. But in this embodiment, this phase error is detected from the RS, and the synthesized phases of the FIFO parts, the decoder 32 and the S/P conversion circuit 46 are resynchronized.

Further, the present invention is not limited to these embodiments, but various variations and modifications may be made without departing from the scope of the present invention.

What is claimed is:

1. A decoding unit which decodes data reproduced from a recording medium and obtained via first phase locked loop (PLL) means and second phase locked loop (PLL) means which are mutually independent and oscillate at frequencies which are approximately the same, said recording medium being recorded with pulse width modulation (PWM) data which are obtained by converting data encoded by a predetermined modulation code that generates a pattern having a D.C. component, said decoding unit comprising:

first storage means for successively storing a positive polarity data portion of the PWM data obtained via the first PLL means and a negative polarity data portion of the PWM data obtained via the second PLL means;

first delay means for delaying the positive polarity data portion;

second delay means for delaying the negative polarity data portion;

second storage means for successively storing a delayed positive polarity data portion obtained via said first delay means and a delayed negative polarity data portion obtained via said second delay means;

control means for controlling write and read timings of said first storage means and input and output timings of said first delay means in synchronism with a first clock obtained via the first PLL means, and for controlling a write timing of said second storage means and an input timing of said second delay means in synchronism with a second clock obtained via the second PLL means, said control means controlling a read timing of said second storage means and an output timing of said second delay means in synchronism with said first clock; and a decoder which decodes the data successively read from said first and second storage means.

2. The decoding unit as claimed in claim 1, wherein at least one of said first storage means and said second storage means comprises a first-in-first-out (FIFO).

3. The decoding unit as claimed in claim 1, wherein at least one of said first delay means and said second delay means comprises a shift register.

4. The decoding unit as claimed in claim 1, wherein:

write and read operations of said first storage means, input and output operations of said first delay means, a read operation of said second storage means and an output operation of said second delay means are enabled in response to a first enable signal;

a write operation of said second storage means and an input operation of said second delay means are enabled in response to a second enable signal; and said first enable signal asserts prior to said second enable signal.

5. The decoding unit as claimed in claim 4, wherein a time difference of asserts made by said first and second enable signals is at least shorter than one period of one of said first and second enable signals.

6. The decoding unit as claimed in claim 1, wherein:

a VFO synchronizing field is inserted within a recording field which includes a data field so as to synchronize the first and second PLL means when recording the PWM data on the recording medium by converting the encoded data into the PWM data, and said decoding unit further comprises:

first detection means for generating a first detection signal by detecting the VFO synchronizing field from the positive polarity data portion;

second detection means for generating a second detection signal by detecting the VFO synchronizing field from the negative polarity data portion; and stop means for stopping a read operation of one of said first and second storage means during a time which is based on an error in generation timings of said first and second detection signals.

7. The decoding unit as claimed in claim 1, wherein:

a resynchronizing pattern is provided between two data blocks within a data field and a resynchronizing bytes are inserted therein to achieve synchronization when a clock slip occurs within the data field when recording the PWM data on the recording medium by converting the encoded data into the PWM data, and said decoding unit further comprises:

first comparison means for generating a first detection signal by comparing the data successively read from said first storage means and the resynchronizing pattern; and second comparison means for generating a second detection signal by comparing the data successively read from said second storage means and the resynchronizing pattern.

8. The decoding unit as claimed in claim 7, wherein said first and second comparison means detect the resynchronizing pattern based on detection windows which are generated by counting the first clock.

9. The decoding unit as claimed in claim 7, which further comprises:

reload means for reloading a counted value of a reading count of said second storage means when an error is detected between timings of said first and second detection signals.

10. The decoding unit as claimed in claim 1, which further comprises:

means for supplying a logical sum of outputs of said first and second delay means to said decoder as modulated data.

11. The decoding unit as claimed in claim 1, wherein said predetermined modulation code is a run length limited (RLL)(1, 7) modulation code.

12. A storage unit comprising:

reproducing means for reproducing data from a recording medium which is recorded with pulse width modulation (PWM) data which are obtained by converting data encoded by a predetermined modulation code that generates a pattern having a D.C. component;

first phase locked loop (PLL) means and second phase locked loop (PLL) means, supplied with the data reproduced by said reproducing means, said first and second PLL means being mutually independent and oscillating at frequencies which are approximately the same; and a decoding unit which decodes data obtained via said first and second PLL means, said decoding unit comprising:

first storage means for successively storing a positive polarity data portion of the PWM data obtained via said first PLL means and a negative polarity data portion of the PWM data obtained via said second PLL means;

first delay means for delaying the positive polarity data portion;

second delay means for delaying the negative polarity data portion;

second storage means for successively storing a delayed positive polarity data portion obtained via said first delay means and a delayed negative polarity data portion obtained via said second delay means;

control means for controlling write and read timings of said first storage means and input and output timings of said first delay means in synchronism with a first clock obtained via said first PLL means, and for controlling a write timing of said second storage means and an input timing of said second delay means in synchronism with a second clock obtained via said second PLL means, said control means controlling a read timing of said second storage means and an output timing of said second delay means in synchronism with said first clock; and a decoder which decodes the data successively read from said first and second storage means.

13. The storage unit as claimed in claim 12, wherein at least one of said first storage means and said second storage means comprises a first-in-first-out (FIFO).

14. The storage unit as claimed in claim 12, wherein at least one of said first delay means and said second delay means comprises a shift register.

15. The storage unit as claimed in claim 12, wherein:

write and read operations of said first storage means, input and output operations of said first delay means, a read operation of said second storage means and an output operation of said second delay means are enabled in response to a first enable signal;

a write operation of said second storage means and an input operation of said second delay means are enabled in response to a second enable signal; and said first enable signal asserts prior to said second enable signal.

16. The storage unit as claimed in claim 15, wherein a time difference of asserts made by said first and second enable signals is at least shorter than one period of one of said first and second enable signals.

17. The storage unit as claimed in claim 12, wherein:

a VFO synchronizing field is inserted within a recording field which includes a data field so as to synchronize said first and second PLL means when recording the PWM data on the recording medium by converting the encoded data into the PWM data, and said decoding unit further comprises:

first detection means for generating a first detection signal by detecting the VFO synchronizing field from the positive polarity data portion;

second detection means for generating a second detection signal by detecting the VFO synchronizing field from the negative polarity data portion; and stop means for stopping a read operation of one of said first and second storage means during a time which is based on an error in generation timings of said first and second detection signals.

18. The storage unit as claimed in claim 12, wherein:

a resynchronizing pattern is provided between two data blocks within a data field and a resynchronizing bytes are inserted therein to achieve synchronization when a clock slip occurs within the data field when recording the PWM data on the recording medium by converting the encoded data into the PWM data, and said decoding unit further comprises:

first comparison means for generating a first detection signal by comparing the data successively read from said first storage means and the resynchronizing pattern; and second comparison means for generating a second detection signal by comparing the data successively read from said second storage means and the resynchronizing pattern.

19. The storage unit as claimed in claim 18, wherein said first and second comparison means detect the resynchronizing pattern based on detection windows which are generated by counting the first clock.

20. The storage unit as claimed in claim 18, wherein said decoding unit further comprises:

reload means for reloading a counted value of a reading count of said second storage means when an error is detected between timings of said first and second detection signals.

21. The storage unit as claimed in claim 12, wherein said decoding unit further comprises:

means for supplying a logical sum of outputs of said first and second delay means to the decoder as modulated data.

22. The storage unit as claimed in claim 12, wherein said predetermined modulation code is a run length limited (RLL)(1, 7) modulation code.

* * * * *

UNITED STATES PATENT AND TRADEMARK OFFICE
CERTIFICATE OF CORRECTION

PATENT NO. : 5,732,056
DATED : March 24, 1998
INVENTOR(S) : Shigenori Yanagi

It is certified that error appears in the above-identified patent and that said Letters Patent is hereby corrected as shown below:

On the title page: Item [22]

Filed:" delete "Jan. 11, 1996"

and insert --Jan. 8, 1996-- therefor

Signed and Sealed this

Twenty-ninth Day of February, 2000

Attest:

Q. TODD DICKINSON

*Attesting Officer*     *Commissioner of Patents and Trademarks*